US012745502B2

(12) United States Patent
Kan et al.

(10) Patent No.: US 12,745,502 B2
(45) Date of Patent: Sep. 22, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Shilei Kan, Wuhan (CN); Sheng Chen, Wuhan (CN); Liang Sun, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 350 days.

(21) Appl. No.: 18/688,253

(22) PCT Filed: Dec. 21, 2023

(86) PCT No.: PCT/CN2023/140660

§ 371 (c)(1), (2) Date: Feb. 29, 2024

(87) PCT Pub. No.: WO2025/123400

PCT Pub. Date: Jun. 19, 2025

(65) Prior Publication Data

US 2025/0204122 A1 Jun. 19, 2025

(30) Foreign Application Priority Data

Dec. 15, 2023 (CN) ........................ 202311734786.5

(51) Int. Cl.
*H10H 29/14* (2025.01)

(52) U.S. Cl.
CPC ................................ *H10H 29/142* (2025.01)

(58) Field of Classification Search
CPC .... H10H 29/142; H10H 20/857; H10W 90/00
See application file for complete search history.

(56) References Cited

U.S. PATENT DOCUMENTS 12,176,378 B2 * 12/2024 Chae ..................... H10H 29/14
2017/0288093 A1 10/2017 Cha et al.

FOREIGN PATENT DOCUMENTS

CN 110246953 A 9/2019
CN 110870065 A 3/2020
CN 112701137 A 4/2021

OTHER PUBLICATIONS

International Search Report in International application No. PCT/CN2023/140660, mailed Mar. 19, 2014, with English translation.

(Continued)

*Primary Examiner* — David Vu
(74) *Attorney, Agent, or Firm* — HSML P.C.

(57) ABSTRACT

A display panel including a drive substrate, a first LED structure, a second LED structure and a third LED structure that are disposed to be sequentially stacked and at least one electrical switching member. The at least one electrical switching member is disposed on a side of the third LED structure adjacent to the drive substrate. One of the electrical switching members is correspondingly connected to and disposed on one of the conductive pads. At least one of the first independent electrode, the second independent electrode, and the third independent electrode is connected to one of the electrical switching members through a through-hole.

20 Claims, 9 Drawing Sheets

(56) References Cited

OTHER PUBLICATIONS

Written Opinion of the International Search Authority in International application No. PCT/CN2023/140660, mailed Mar. 19, 2014, with English translation.

* cited by examiner

DISPLAY PANEL

This application is a US national phase application based upon an International Application No. PCT/CN2023/140660, filed on Dec. 21, 2023, which claims priority to Chinese Patent Application No. 202311734786.5, filed on Dec. 15, 2023, and entitled "Display Panel", the contents of which are incorporated herein by reference in their entireties. The present disclosure relates to the field of display technologies, and more particularly, to a display panel.

TECHNICAL FIELD

Background

In the related art, micro light-emitting diodes (LEDs) are considered to be the best display solutions for AR (Augmented Reality) and VR (Virtual Reality) products, and micro semiconductor LEDs are excellent in terms of both brightness and product life. At present, monochromatic micro semiconductor LEDs can be used to achieve the manufacturing and production of high-resolution displays, but there are still significant technical challenges in the manufacturing of full-color display panels of high resolution.

In the related art, R/G/B monochromatic micro LEDs are transferred to a drive substrate through the mass transfer process to assemble and manufacture full-color displays. However, it is very challenging to integrate millions or even tens of millions of micro LEDs with a pixel drive circuit array. It has become very difficult to ensure the stability and efficiency of manufacturing processes and the transfer reliability, and this approach cannot achieve micro LED displays of higher resolutions.

SUMMARY

Embodiments of the present disclosure provide a display panel that may have improved resolution.

Embodiments of the present disclosure provide a display panel including:

A drive substrate including a plurality of conductive pads disposed at intervals;

A plurality of pixels disposed on the drive substrate, each pixel including:

A first LED structure disposed on the drive substrate, the first LED structure including a first independent electrode located on a side away from the drive substrate, the first independent electrode being electrically connected to one of the conductive pads;

A second LED structure disposed on a side of the first LED structure away from the drive substrate, the second LED structure including a second independent electrode located on a side away from the first LED structure, the second independent electrode being electrically connected to another one of the conductive pads;

A third LED structure disposed on a side of the second LED structure away from the drive substrate, the third LED structure including a third independent electrode located on a side away from the second LED structure, the third independent electrode being electrically connected to yet another one of the conductive pads; and At least one electrical switching member disposed on a side of the third LED structure adjacent to the drive substrate, one of the electrical switching members being correspondingly connected to and disposed on one of the conductive pads;

Wherein at least one of the first independent electrode, the second independent electrode, and the third independent electrode is connected to one of the electrical switching members through a through-hole; in a direction perpendicular to a panel surface of the display panel, the through-hole is disposed to overlap with the electrical switching member.

DETAILED DESCRIPTION

Figure 1:
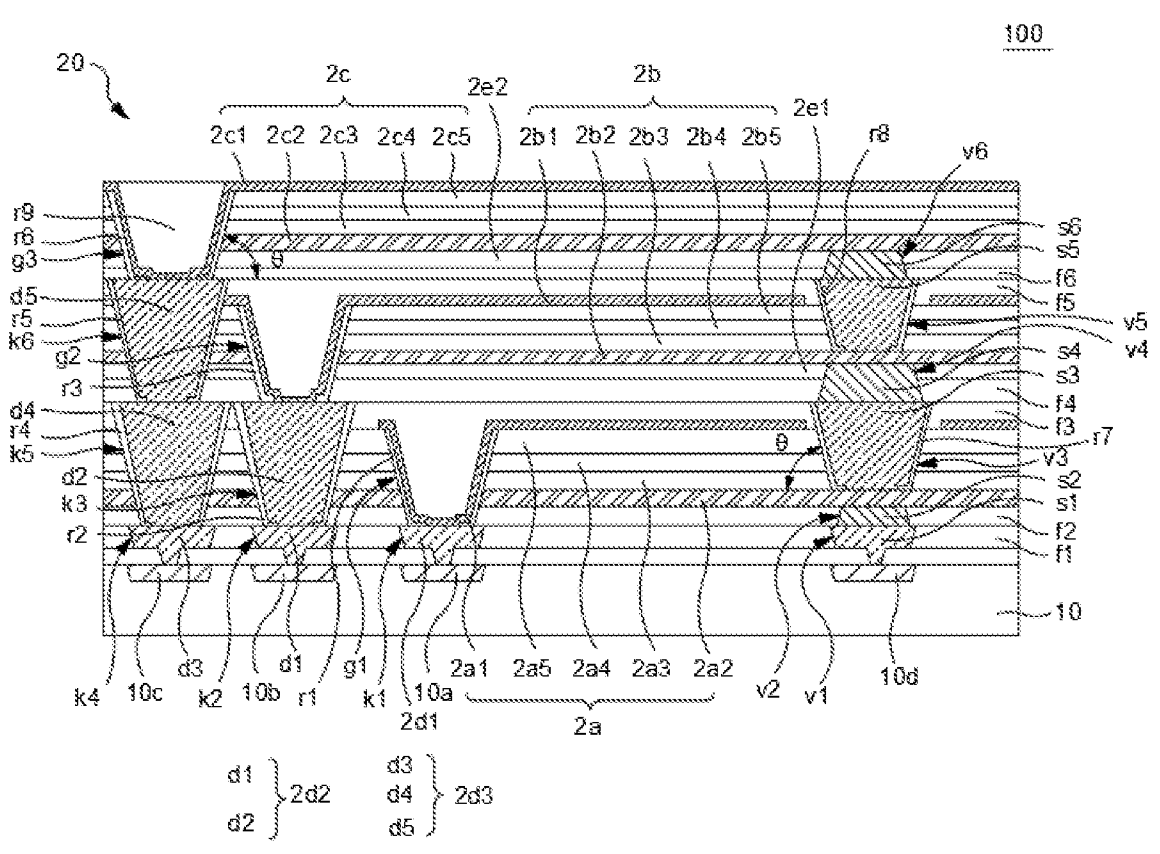
FIG. 1 is a schematic diagram of a structure of a display panel according to an embodiment of the present disclosure.

In the following, the technical solutions in the embodiments of the present disclosure will be clearly and completely described in connection with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the present disclosure. In the present disclosure, unless otherwise specified, directional words used herein such as "up" and "down" usually refer to up and down directions of a device in actual use or an operational state, and in particular, to directions as shown in the drawings. References of "inside" and "outside" are made with respect to an outline of the device. The terms "first", "second", "third", etc. are only used as indicators and do not impose numerical requirements or establish an order.

Embodiments of the present disclosure provide a display panel, which is described in detail below. It should be noted that the order in which the following embodiments are described is not intended to define a preferred order of the embodiments.

It should be appreciated that, in the related art, in order to improve the resolution of a micro LED panel and to avoid a mass transfer process, a stacked tricolor light-emitting diode (LED) is directly formed on a silicon substrate having thin-film transistors. However, when a tricolor LED stack is formed by way of direct stacking, the preparing efficiency is relatively low. The depth of the hole that needs to be open for the LED farthest from the substrate is too deep, and the planar size of the deep hole is large. Moreover, frequent cases of N-electrode(s) being broken within the deep hole have occurred, resulting in reduced resolution and less than expected LED luminous effect.

Therefore, according to the display panel of the embodiments of the present disclosure, an electrical switching member is disposed between at least one of a first independent electrode, a second independent electrode, and a third independent electrode and a corresponding conductive pad, so that the depth of a through-hole is reduced, thereby reducing the size of the through-hole, which in turn improves the resolution and reduces the risk that independent electrode(s) is easily broken in the through-hole.

Embodiments of the present disclosure provide a display panel including:

A drive substrate including a plurality of conductive pads disposed at intervals;

A plurality of pixels disposed on the drive substrate, each pixel including:

A first LED structure disposed on the drive substrate, the first LED structure including a first independent electrode located on a side away from the drive substrate, the first independent electrode being electrically connected to one of the conductive pads;

A second LED structure disposed on a side of the first LED structure away from the drive substrate, the second LED structure including a second independent electrode located on a side away from the first LED structure, the second independent electrode being electrically connected to another one of the conductive pads;

A third LED structure disposed on a side of the second LED structure away from the drive substrate, the third LED structure including a third independent electrode located on a side away from the second LED structure, the third independent electrode being electrically connected to yet another one of the conductive pads; and At least one electrical switching member disposed on a side of the third LED structure adjacent to the drive substrate, one of the at least one electrical switching member being correspondingly connected to and disposed on one of the conductive pads;

Wherein at least one of the first independent electrode, the second independent electrode, and the third independent electrode is connected to one of the at least one electrical switching member through one of at least one through-hole; in a direction perpendicular to a panel surface of the display panel, the through-hole is disposed to overlap with the electrical switching member.

Optionally, in some embodiments of the present disclosure, the display panel further includes a first bonding layer and a second bonding layer, materials of the first bonding layer and the second bonding layer both being insulating materials, the first bonding layer being connected to and disposed on a surface of the drive substrate adjacent to the first LED structure, the second bonding layer being connected to and disposed on a surface of the first LED structure adjacent to the drive substrate, and the first bonding layer being bonded to the second bonding layer;

The first LED structure includes a first common electrode, a first conductive type semiconductor layer, a first light-emitting material layer, a second conductive type semiconductor layer, and the first independent electrode, which are sequentially stacked on a surface of the second bonding layer away from the drive substrate;

The at least one electrical switching member includes a first electrical switching member, and the plurality of conductive pads includes a first conductive pad, the first bonding layer being provided with a first hollow hole exposing the first conductive pad, and the first electrical switching member being filled in the first hollow hole and connected to the first conductive pad;

The at least one through-hole includes a first through-hole provided in the first LED structure, the first through-hole extending through the second conductive type semiconductor layer, the first light-emitting material layer, the first conductive type semiconductor layer, the first common electrode, and the second bonding layer, the first independent electrode extending over the first through-hole and being connected to the first electrical switching member.

Optionally, in some embodiments of the present disclosure, the display panel further includes a third bonding layer and a fourth bonding layer, materials of the third bonding layer and the fourth bonding layer both being insulating materials, the third bonding layer being connected to and disposed on a surface of the first LED structure adjacent to the second LED structure, the fourth bonding layer being connected to and disposed on a surface of the second LED structure adjacent to the drive substrate, and the third bonding layer being bonded to the fourth bonding layer;

The second LED structure includes a second common electrode, a third conductive type semiconductor layer, a second light-emitting material layer, a fourth conductive type semiconductor layer, and the second independent electrode, which are sequentially stacked on a surface of the fourth bonding layer away from the drive substrate;

The plurality of conductive pads includes a second conductive pad, and the at least one electrical switching member includes a second electrical switching member, the second electrical switching member including a first connecting part and a second connecting part, the first bonding layer being provided with a second hollow hole exposing the second conductive pad, the first connecting part being filled in the second hollow hole and connected to the second conductive pad, the first LED structure being provided with a third hollow hole, the third hollow hole extending through the third bonding layer, the second conductive type semiconductor layer, the first light-emitting material layer, the first conductive type semiconductor layer, the first common electrode and the second bonding layer and exposing the first connecting part, and the second connecting part being filled in the third hollow hole and connected to the first connecting part;

The at least one through-hole includes a second through-hole provided in the second LED structure, the second through-hole extending through the fourth conductive type semiconductor layer, the second light-emitting material layer, the third conductive type semiconductor layer, the second common electrode, and the fourth bonding layer, the second independent electrode extending over the second through-hole and being connected to the second connecting part.

Optionally, in some embodiments of the present disclosure, the display panel further includes a fifth bonding layer and a sixth bonding layer, materials of the fifth bonding layer and the sixth bonding layer both being insulating materials, the fifth bonding layer being connected to and disposed on a surface of the second LED structure adjacent to the third LED structure, the sixth bonding layer being connected to and disposed on a surface of the third LED structure adjacent to the drive substrate, and the fifth bonding layer being bonded to the sixth bonding layer;

The third LED structure includes a third common electrode, a fifth conductive type semiconductor layer, a third light-emitting material layer, a sixth conductive type semiconductor layer, and the third independent electrode, which are sequentially stacked on a surface of the sixth bonding layer away from the drive substrate;

The plurality of conductive pads includes a third conductive pad, and the at least one electrical switching member includes a third electrical switching member, the third electrical switching member including a third connecting part, a fourth connecting part, and a fifth connecting part, the first bonding layer being provided with a fourth hollow hole exposing the third conductive pad, the third connecting part being filled in the fourth hollow hole and connected to the third conductive pad; the first LED structure is provided with a fifth hollow hole, the fifth hollow hole extending through the third bonding layer, the second conductive type semiconductor layer, the first light-emitting material layer, the first conductive type semiconductor layer, the first common electrode, and the second bonding layer and exposing the third connecting part, the fourth connecting part being filled in the fifth hollow hole and connected to the third connecting part; the second LED structure being provided with a sixth hollow hole, the sixth hollow hole extending through the fifth bonding layer, the fourth conductive type semiconductor layer, the second light-emitting material layer, the third conductive type semiconductor layer, the second common electrode, and the fourth bonding layer and exposing the fourth connecting part, and the fifth connecting part being filled in the sixth hollow hole and connected to the fourth connecting part;

The at least one through-hole includes a third through-hole provided in the third LED structure, the third through-hole extending through the sixth conductive type semiconductor layer, the third light-emitting material layer, the fifth conductive type semiconductor layer, the third common electrode, and the sixth bonding layer, and the third independent electrode extending over the third through-hole and being connected to the fifth connecting part.

Optionally, in some embodiments of the present disclosure, in the direction perpendicular to the panel surface of the display panel, the first through-hole is aligned with the first hollow hole; the second through-hole, the second hollow hole, and the third hollow hole being aligned; and the third through-hole, the fourth hollow hole, the fifth hollow hole, and the sixth hollow hole being aligned.

Optionally, in some embodiments of the present disclosure, slope angles of the first through-hole to the third through-hole and the first hollow hole to the sixth hollow hole are each between 85 degrees and 90 degrees.

Optionally, in some embodiments of the present disclosure, the plurality of conductive pads further includes a fourth conductive pad, the first common electrode, the second common electrode, and the third common electrode each being electrically connected to the fourth conductive pad;

The first bonding layer is provided with a first opening, the first opening being filled with a first conductive bonding part, the first conductive bonding part being connected to the fourth conductive pad; the second bonding layer is provided with a second opening, the second opening being filled with a second conductive bonding part, and the second conductive bonding part being connected to the first common electrode and being bonded to the first conductive bonding part;

The third bonding layer is provided with a third opening, the third opening further extending through the first independent electrode, the second conductive type semiconductor layer, the first light-emitting material layer, and the first conductive type semiconductor layer, the third opening being filled with a third conductive bonding part, the third conductive bonding part being connected to the first common electrode, the fourth bonding layer being provided with a fourth opening, the fourth opening being filled with a fourth conductive bonding part, and the fourth conductive bonding part being connected to the second common electrode and bonded to the third conductive bonding part;

The fifth bonding layer is provided with a fifth opening, the fifth opening further extending through the second independent electrode, the fourth conductive type semiconductor layer, the second light-emitting material layer, and the third conductive type semiconductor layer, the fifth opening being filled with a fifth conductive bonding part, the fifth conductive bonding part being connected to the second common electrode, the sixth bonding layer being provided with a sixth opening, the sixth opening being filled with a sixth conductive bonding part, and the sixth conductive bonding part being connected to the third common electrode and bonded to the fifth conductive bonding part.

Optionally, in some embodiments of the present disclosure, the first opening to the sixth opening are disposed to be aligned in the direction perpendicular to the panel surface of the display panel.

Optionally, in some embodiments of the present disclosure, a first insulating layer is disposed between a portion of the first independent electrode extending into the first through-hole and a sidewall of the first through-hole;

A second insulating layer is disposed between the second connecting part and a sidewall of the third hollow hole, and a third insulating layer is disposed between a portion of the second independent electrode extending into the second through-hole and a sidewall of the second through-hole;

A fourth insulating layer is further disposed on sidewalls of the fourth connecting part and the fifth hollow hole, a fifth insulating layer is disposed between the fifth connecting part and a sidewall of the sixth hollow hole, and a sixth insulating layer is disposed between a portion of the third independent electrode extending into the third through-hole and a sidewall of the third through-hole;

A seventh insulating layer is disposed between the third conductive bonding part and a sidewall of the third opening, and an eighth insulating layer is disposed between the fifth conductive bonding part and a sidewall of the fifth opening.

Optionally, in some embodiments of the present disclosure, the display panel further includes a first bonding layer and a second bonding layer, materials of the first bonding layer and the second bonding layer both being metal materials, the first bonding layer being connected to and disposed on a surface of the drive substrate adjacent to the first LED structure, the second bonding layer being connected to and disposed on a surface of the first LED structure adjacent to the drive substrate, and the first bonding layer being bonded to the second bonding layer;

The first LED structure includes a first common electrode, a first conductive type semiconductor layer, a first light-emitting material layer, a second conductive type semiconductor layer, and the first independent electrode, which are sequentially stacked on a surface of the second bonding layer away from the drive substrate;

The plurality of conductive pads includes a first conductive pad, and the at least one through-hole includes a first through-hole provided in the first LED structure, the first through-hole extending through the second conductive type semiconductor layer, the first light-emitting material layer, the first conductive type semiconductor layer, the first common electrode, the second bonding layer, and the first bonding layer and exposing the first conductive pad, the first independent electrode extending over the first through-hole and being connected to the first conductive pad.

Optionally, in some embodiments of the present disclosure, the display panel further includes a third bonding layer and a fourth bonding layer, materials of the third bonding layer and the fourth bonding layer both being insulating materials, the third bonding layer being connected to and disposed on a surface of the first LED structure adjacent to the second LED structure, the fourth bonding layer being connected to and disposed on a surface of the second LED structure adjacent to the drive substrate, and the third bonding layer being bonded to the fourth bonding layer;

The second LED structure includes a second common electrode, a third conductive type semiconductor layer, a second light-emitting material layer, a fourth conductive type semiconductor layer, and the second independent electrode, which are sequentially stacked on a surface of the fourth bonding layer away from the drive substrate;

The plurality of conductive pads includes a second conductive pad, the at least one electrical switching member includes a first electrical switching member, and the first LED structure is provided with a first hollow hole, the first hollow hole extending through the third bonding layer, the second conductive type semiconductor layer, the first light-emitting material layer, the first conductive type semiconductor layer, the first common electrode, the second bonding layer and the first bonding layer and exposing the second conductive pad, and the first electrical switching member being filled in the first hollow hole and connected to the second conductive pad;

The at least one through-hole includes a second through-hole provided in the second LED structure, the second through-hole extending through the fourth conductive type semiconductor layer, the second light-emitting material layer, the third conductive type semiconductor layer, the second common electrode, and the fourth bonding layer, the second independent electrode extending over the second through-hole and being connected to the first electrical switching member.

Optionally, in some embodiments of the present disclosure, the display panel further includes a fifth bonding layer and a sixth bonding layer, materials of the fifth bonding layer and the sixth bonding layer both being insulating materials, the fifth bonding layer being connected to and disposed on a surface of the second LED structure adjacent to the third LED structure, the sixth bonding layer being connected to and disposed on a surface of the third LED structure adjacent to the drive substrate, and the fifth bonding layer being bonded to the sixth bonding layer;

The third LED structure includes a third common electrode, a fifth conductive type semiconductor layer, a third light-emitting material layer, a sixth conductive type semiconductor layer, and the third independent electrode, which are sequentially stacked on a surface of the sixth bonding layer away from the drive substrate;

The plurality of conductive pads includes a third conductive pad, and the at least one electrical switching member includes a second electrical switching member, the second electrical switching member including a first connecting part and a second connecting part, the first LED structure being provided with a second hollow hole, the second hollow hole extending through the third bonding layer, the second conductive type semiconductor layer, the first light-emitting material layer, the first conductive type semiconductor layer, the first common electrode, the second bonding layer and the first bonding layer and exposing the third conductive pad, the first connecting part being filled in the second hollow hole and connected to the third conductive pad; the second LED structure is provided with a third hollow hole, the third hollow hole extending through the fifth bonding layer, the fourth conductive type semiconductor layer, the second light-emitting material layer, the third conductive type semiconductor layer, the second common electrode, and the fourth bonding layer and exposing the first connecting part, and the second connecting part being filled in the third hollow hole and connected to the first connecting part;

The at least one through-hole includes a third through-hole provided in the third LED structure, the third through-hole extending through the sixth conductive type semiconductor layer, the third light-emitting material layer, the fifth conductive type semiconductor layer, the third common electrode, and the sixth bonding layer, and the third independent electrode extending over the third through-hole and being connected to the second connecting part.

Optionally, in some embodiments of the present disclosure, in the direction perpendicular to the panel surface of the display panel, the second through-hole is aligned with the first hollow hole; and the third through-hole, the second hollow hole and the third hollow hole being aligned.

Optionally, in some embodiments of the present disclosure, slope angles of the first through-hole to the third through-hole and the first hollow hole to the third hollow hole are each between 85 degrees and 90 degrees.

Optionally, in some embodiments of the present disclosure, the plurality of conductive pads further includes a fourth conductive pad; the first common electrode, the second common electrode, the third common electrode, and the second bonding layer each being electrically connected to the fourth conductive pad, and the first bonding layer being connected to the fourth conductive pad;

The third bonding layer is provided with a first opening, the first opening further extending through the first independent electrode, the second conductive type semiconductor layer, the first light-emitting material layer, the first conductive type semiconductor layer, and the first common electrode, the first opening being filled with a first conductive bonding part, the first conductive bonding part being connected to the second bonding layer; the fourth bonding layer is provided with a second opening, the second opening being filled with a second conductive bonding part, and the second conductive bonding part being connected to the second common electrode and being bonded to the first conductive bonding part;

The fifth bonding layer is provided with a third opening, the third opening further extending through the second independent electrode, the fourth conductive type semiconductor layer, the second light-emitting material layer, and the third conductive type semiconductor layer, the third opening being filled with a third conductive bonding part, the third conductive bonding part being connected to the second common electrode; the sixth bonding layer is provided with a fourth opening, the fourth opening being filled with a fourth conductive bonding part, and the fourth conductive bonding part being connected to the third common electrode and bonded to the third conductive bonding part.

Optionally, in some embodiments of the present disclosure, the first opening to the fourth opening are disposed to be aligned in the direction perpendicular to the panel surface of the display panel.

Optionally, in some embodiments of the present disclosure, a first insulating layer is disposed between a portion of the first independent electrode extending into the first through-hole and a sidewall of the first through-hole;

A second insulating layer is disposed between the first electrical switching member and a sidewall of the first hollow hole, and a third insulating layer is disposed between a portion of the second independent electrode extending into the second through-hole and a sidewall of the second through-hole;

A fourth insulating layer is further disposed on sidewalls of the first connecting part and the second hollow hole, a fifth insulating layer is disposed between the second connecting part and a sidewall of the third hollow hole, and a sixth insulating layer is disposed between a portion of the third independent electrode extending into the third through-hole and a sidewall of the third through-hole;

A seventh insulating layer is disposed between the first conductive bonding part and a sidewall of the first opening, and an eighth insulating layer is disposed between the third conductive bonding part and a sidewall of the third opening.

Optionally, in some embodiments of the present disclosure, the first conductive type semiconductor layer, the third conductive semiconductor layer, and the fifth conductive semiconductor layer are P-type semiconductor layers, and the second conductive type semiconductor layer, the fourth conductive semiconductor layer, and the sixth conductive semiconductor layer are N-type semiconductor layers.

Optionally, in some embodiments of the present disclosure, the first LED structure is configured to emit red light, the second LED structure is configured to emit green light, and the third LED structure is configured to emit blue light.

Optionally, in some embodiments of the present disclosure, the display panel further includes a first Bragg reflective layer and a second Bragg reflective layer, the first Bragg reflective layer being disposed between the fourth bonding layer and the second common electrode and configured for reflecting light emitted by the second LED structure and transmitting light emitted by the first LED structure;

The second Bragg reflective layer is disposed between the sixth bonding layer and the third common electrode, the second Bragg reflective layer being configured for reflecting light emitted by the third LED structure and transmitting light emitted by the first LED structure and the second LED structure.

Optionally, in some embodiments of the present disclosure, a width of each of the first through-hole, the second through-hole, and the third through-hole is less than or equal to 1 micron.

Optionally, in some embodiments of the present disclosure, each of the pixels has a first corner area, a second corner area, a third corner area, and a fourth corner area, the first through-hole being disposed in the first corner area, the second through-hole being disposed in the second corner area, the third through-hole being disposed in the third corner area, and the first opening being disposed in the fourth corner area in an orthographic projection of the display panel.

The display panel according to embodiments of the present disclosure includes a drive substrate, a first LED structure, a second LED structure, a third LED structure, and at least one electrical switching member, the at least one electrical switching members being disposed on a side of the third LED structure adjacent to the drive substrate, one of the at least one electrical switching members being correspondingly connected to and disposed on one of the conductive pads; at least one of the first independent electrode, the second independent electrode, and the third independent electrode is connected to one of the at least one electrical switching members through one of at least one through-hole; in a direction perpendicular to a panel surface of the display panel, the through-hole is disposed to overlap with the electrical switching member. According to the embodiments of the present disclosure, by disposing an electrical switching member between at least one of the first independent electrode, the second independent electrode, and the third independent electrode and a corresponding conductive pad, the depth of the through-hole is reduced, thereby reducing the size of the through-hole, which in turn improves the resolution and reduces the risk that the independent electrode(s) is easily broken in the through-hole.

Referring to FIG. 1, embodiments of the present disclosure provide a display panel 100 including a drive substrate 10 and a plurality of pixels 20. The plurality of pixels 20 are disposed on the drive substrate 10.

The drive substrate 10 includes a plurality of conductive pads disposed at intervals. Each of the pixels 20 includes a first LED structure **2*a*, a second LED structure 2*b*, and a third LED structure 2*c* disposed in a stack. The pixel 20 further includes at least one electrical switching member. The at least one electrical switching member is disposed on a side of the third LED structure 2*c* adjacent to the drive substrate 10**. One of the at least one electrical switching member is correspondingly connected to and disposed on one of the conductive pads.

The first LED structure 2*a* is disposed on the drive substrate 10. The first LED structure 2*a* includes a first independent electrode 2*a*1 located on a side away from the drive substrate 10. The first independent electrode 2*a*1 is electrically connected to one of the conductive pads.

The wavelength of light emitted by the second LED structure 2*b* is smaller than the wavelength of light emitted by the first LED structure 2*a*. The second LED structure 2*b* is disposed on a side of the first LED structure 2*a* away from the drive substrate 10. The second LED structure 2*b* includes a second independent electrode 2*b*1 located on a side away from the first LED structure 2*a*. The second independent electrode 2*b*1 is electrically connected to another one of the conductive pads.

The wavelength of light emitted by the third LED structure 2*c* is smaller than the wavelength of light emitted by the second LED structure 2*b*. The third LED structure 2*c* is disposed on a side of the second LED structure 2*b* away from the drive substrate 10. The third LED structure 2*c* includes a third independent electrode 2*c*1 located on a side away from the second LED structure 2*b*. The second independent electrode 2*c*1 is electrically connected to yet another one of the conductive pads.

At least one of the first independent electrode 2*a*1, the second independent electrode 2*b*1, and the third independent electrode 2*c*1 is connected to one of the at least one electrical switching member through a through-hole. In a direction perpendicular to a panel surface of the display panel 100, the through-hole is disposed to overlap with the electrical switching member.

According to the display panel 100 of the embodiment of the present disclosure, an electrical switching member is disposed between at least one of the first independent electrode 2*a*1, the second independent electrode 2*b*1, and the third independent electrode 2*c*1 and a corresponding conductive pad, so that the depth of the through-hole is reduced, thereby reducing the size of the through-hole, which in turn improves the resolution and reduces the risk that the independent electrode(s) is easily broken in the through-hole.

Optionally, the drive substrate 10 may be a drive substrate in which thin-film transistors are formed.

Optionally, the first LED structure 2*a* may be an inorganic light-emitting diode structure configured to emit red light, the second LED structure 2*b* may be an inorganic light-emitting diode structure configured to emit green light, and the third LED structure 2*c* may be an inorganic light-emitting diode structure configured to emit blue light.

The color of light each of the first LED structure 2*a*, the second LED structure 2*b*, and the third LED structure 2*c* emits may be adjusted according to actual requirements.

Optionally, the material of the electrical switching member(s) may be a metal or metal alloy, such as at least one of copper, gold, silver, tin, nickel, gold-tin alloy, and nickel-tin alloy.

The present embodiment is explained by taking the pixel 20 having three electrical switching members as an example. In some embodiments, the number of the electrical switching member(s) may be one, that is, one of the first independent electrode 2*a*1, the second independent electrode 2*b*1, and the third independent electrode 2*c*1 is connected to an electrical switching member through a through-hole. In addition, the number of the electrical switching members may be two, and two of the first independent electrode 2*a*1, the second independent electrode 2*b*1, and the third independent electrode 2*c*1 are respectively connected to an electrical switching member through a through-hole.

Optionally, the display panel 100 further includes a first bonding layer f1 and a second bonding layer f2. The materials of the first bonding layer f1 and the second bonding layer f2 are both insulating materials. The first bonding layer f1 is connected to and disposed on a surface of the drive substrate 10 adjacent to the first LED structure 2*a*, and the second bonding layer f2 is connected to and disposed on a surface of the first LED structure 2*a* adjacent to the drive substrate 10. The first bonding layer f1 is bonded to the second bonding layer f2.

The first LED structure 2*a* includes a first common electrode 2*a*2, a first conductive type semiconductor layer 2*a*3, a first light-emitting material layer 2*a*4, a second conductive type semiconductor layer 2*a*5, and a first independent electrode 2*a*1, which are sequentially stacked on a surface of the second bonding layer f2 away from the drive substrate 10.

The at least one electrical switching member includes a first electrical switching member 2*d*1. The plurality of conductive pads includes a first conductive pad 10*a*. The first bonding layer f1 is provided with a first hollow hole k1 exposing the first conductive pad 10*a*. The first electrical switching member 2*d*1 is filled in the first hollow hole k1 and is connected to the first conductive pad 10*a*.

The through-hole(s) includes a first through-hole g1 provided in the first LED structure 2*a*. The first through-hole g1 extends through the second conductive type semiconductor layer 2*a*5, the first light-emitting material layer 2*a*4, the first conductive type semiconductor layer 2*a*3, the first common electrode 2*a*2, and the second bonding layer f2. The first independent electrode 2*a*1 extends over the first through-hole g1 and is connected to the first electrical switching member 2*d*1.

In the present embodiment, the first independent electrode 2*a*1 extends into the first through-hole g1 and is connected to the first electrical switching member 2*d*1, that is, the first independent electrode 2*a*1 is connected to the first conductive pad 10*a* of the drive substrate 10 through the first electrical switching member 2*d*1, so that the depth of the first through-hole g1 is reduced, and the planar size of the first through-hole g1 is reduced. The depth of hole wall is shortened, and therefore the portion of the first independent electrode 2*a*1 covering the hole wall of the first through-hole g1 is shortened, thereby reducing the risk that the first independent electrode 2*a*1 is easily broken at the first through-hole g1.

Optionally, the display panel 100 further includes a third bonding layer f3 and a fourth bonding layer f4. The materials of the third bonding layer f3 and the fourth bonding layer f4 are both insulating materials. The third bonding layer f3 is connected to and disposed on a surface of the first LED structure 2*a* adjacent to the second LED structure 2*b*. The fourth bonding layer f4 is connected to and disposed on a surface of the second LED structure 2*b* adjacent to the drive substrate 10. The third bonding layer f3 is bonded to the fourth bonding layer f4.

The second LED structure 2*b* includes a second common electrode 2*b*2, a third conductive type semiconductor layer 2*b*3, a second light-emitting material layer 2*b*4, a fourth conductive type semiconductor layer 2*b*5, and a second independent electrode 2*b*1, which are sequentially stacked on a surface of the fourth bonding layer f4 away from the drive substrate 10.

The plurality of conductive pads includes a second conductive pad 10*b*. The at least one electrical switching member includes a second electrical switching member 2*d*2 including a first connecting part d1 and a second connecting part d2. The first bonding layer f1 is provided with a second hollow hole k2 exposing the second conductive pad 10*b*. The first connecting part d1 is filled in the second hollow hole k2 and is connected to the second conductive pad 10*b*. The first LED structure 2*a* is provided with a third hollow hole k3. The third hollow hole k3 extends through the third bonding layer f3, the second conductive type semiconductor layer 2*a*5, the first light-emitting material layer 2*a*4, the first conductive type semiconductor layer 2*a*3, the first common electrode 2*a*2, and the second bonding layer f2 and exposes the first connecting part d1. The second connecting part d2 is filled in the third hollow hole k3 and is connected to the first connecting part d1.

The through-hole(s) includes a second through-hole g2 provided in the second LED structure 2*b*. The second through-hole g2 extends through the fourth conductive type semiconductor layer 2*b*5, the second light-emitting material layer 2*b*4, the third conductive type semiconductor layer 2*b*3, the second common electrode 2*b*2, and the fourth bonding layer f4. The second independent electrode 2*b*1 extends over the second through-hole g2 and is connected to the second connecting part d2.

In the present embodiment, the second independent electrode 2*b*1 extends into the second through-hole g2 and is connected to the second connecting part d2 of the second electrical switching member 2*d*2, that is, the second independent electrode 2*b*1 is connected to the second conductive pad 10*b* of the drive substrate 10 through the second electrical switching member 2*d*2, so that the depth of the second through-hole g2 is reduced, and the planar size of the second through-hole g2 is reduced. The depth of hole wall is shortened, and therefore the portion of the second independent electrode 2*b*1 covering the hole wall of the second through-hole g2 is shortened, thereby reducing the risk that the second independent electrode 2*b*1 is easily broken at the second through-hole g2.

Optionally, the display panel 100 further includes a fifth bonding layer f5 and a sixth bonding layer f6. The materials of the fifth bonding layer f5 and the sixth bonding layer f6 are both insulating materials. The fifth bonding layer f5 is connected to and disposed on a surface of the second LED structure 2*b* adjacent to the third LED structure 2*c*. The sixth bonding layer f6 is connected to and disposed on a surface of the third LED structure 2*c* adjacent to the drive substrate 10. The fifth bonding layer f5 is bonded to the sixth bonding layer f6.

The third LED structure 2*c* includes a third common electrode 2*c*2, a fifth conductive type semiconductor layer 2*c*3, a third light-emitting material layer 2*c*4, a sixth conductive type semiconductor layer 2*c*5, and a third independent electrode 2*c*1, which are sequentially stacked on a surface of the sixth bonding layer f6 away from the drive substrate 10.

The plurality of conductive pads includes a third conductive pad 10*c*. The at least one electrical switching member includes a third electrical switching member 2*d*3 including a third connecting part d3, a fourth connecting part d4, and a fifth connecting part d5. The first bonding layer f1 is provided with a fourth hollow hole k4 exposing the third conductive pad 10*c*. The third connecting part d3 is filled in the fourth hollow hole k4 and is connected to the third conductive pad 10*c*. The first LED structure 2*a* is provided with a fifth hollow hole k5 which extends through the third bonding layer f3, the second conductive type semiconductor layer 2*a*5, the first light-emitting material layer 2*a*4, the first conductive type semiconductor layer 2*a*3, the first common electrode 2*a*2, and the second bonding layer f2 and exposes the third connecting part d3. The fourth connecting part d4 is filled in the fifth hollow hole k5 and is connected to the third connecting part d3. The second LED structure 2*b* is provided with a sixth hollow hole k6 which extends through the fifth bonding layer f5, the fourth conductive type semiconductor layer 2*b*5, the second light-emitting material layer 2*b*4, the third conductive type semiconductor layer 2*b*3, the second common electrode 2*b*2, and the fourth bonding layer f4 and exposes the fourth connecting part d4. The fifth connecting part d5 is filled in the sixth hollow hole k6 and is connected to the fourth connecting part d4.

The through-hole(s) includes a third through-hole g3 provided in the third LED structure 2*c*. The third through-hole g3 extends through the sixth conductive type semiconductor layer 2*c*5, the third light-emitting material layer 2*c*4, the fifth conductive type semiconductor layer 2*c*3, the third common electrode 2*c*2, and the sixth bonding layer f6. The third independent electrode 2*c*1 extends over the third through-hole g3 and is connected to the fifth connecting part d5.

In the present embodiment, the third independent electrode 2*c*1 extends into the third through-hole g3 and is connected to the third electrical switching member 2*d*3, that is, the third independent electrode 2*c*1 is connected to the third conductive pad 10*c* of the drive substrate 10 through the third electrical switching member 2*d*3, so that the depth of the third through-hole g3 is reduced, and the planar size of the third through-hole g3 is reduced. The depth of hole wall is shortened, and therefore the portion of the third independent electrode 2*c*1 covering the hole wall of the third through-hole g3 is shortened, thereby reducing the risk that the third independent electrode 2*c*1 is easily broken at the third through-hole g3.

Optionally, the first bonding layer f1 to the sixth bonding layer f6 are all transparent organic layers or transparent inorganic layers. The organic layers may include at least one of SU8, poly (methyl methacrylate) (PMMA), polyimide, parylene, benzocyclobutene (BCB). The inorganic layers may include at least one of $Al_2O_3$, $SiO_2$, $SiN_x$.

The materials of the first connecting parts d1 to the fifth connecting parts d5 are all metals or metal alloys, such as at least one of copper, gold, silver, tin, nickel, gold-tin alloy and nickel-tin alloy.

Optionally, in the direction perpendicular to the panel surface of the display panel 100, the first through-hole g1 is aligned with the first hollow hole k1, so as to save the hole-opening area of the first through-hole g1, thereby increasing the light-emitting area of the first LED structure 2*a*, and improving the resolution.

The second through-hole g2, the second hollow hole k2, and the third hollow hole k3 are aligned so as to save the hole-opening area of the second through-hole g2, thereby increasing the light-emitting area of the second LED structure 2*b*, and improving the resolution.

The third through-hole g3, the fourth hollow hole k4, the fifth hollow hole k5, and the sixth hollow hole k6 are aligned to save the hole-opening area of the third through-hole g3, thereby increasing the light-emitting area of the third LED structure 2*c*, and improving the resolution.

Optionally, the first through-hole g1 to the third through-hole g3 and the first hollow hole k1 to the sixth hollow hole k6 each have a slope angle θ between 85 degrees and 90 degrees, for example, 85 degrees, 86 degrees, 87 degrees, 88 degrees, 89 degrees, or 90 degrees.

In the present embodiment, the slope angle θ is set between 85 degrees and 90 degrees, so that the planar sizes of the through-holes and the hollow holes may be reduced, and the effective light-emitting area may be increased.

Optionally, the width of each of the first through-hole g1 to the third through-hole g3 and the first hollow hole k1 to the sixth hollow hole k6 is less than or equal to 1 micron, for example, 1 micron, 0.9 microns, 0.8 microns, 0.7 microns, 0.6 microns, 0.5 microns, 0.4 microns, 0.3 microns, or 0.2 microns.

In the present embodiment, the widths of the through-holes and the hollow holes are limited to 1 micron, so as to ensure that the LED structures have larger light-emitting areas, that is, to reduce the loss of the light-emitting areas of the LED structures.

Optionally, the first independent electrode 2*a*1 to the third independent electrode 2*c*1 and the first common electrode 2*a*2 to the third common electrode 2*c*2 are transparent conductive oxides, for example, $SnO_2$, $InO_2$, ITO, ZnO, IZO, and the like.

The first conductive type semiconductor layer 2*a*3, the third conductive type semiconductor layer 2*b*3, and the fifth conductive type semiconductor layer 2*c*3 are p-type semiconductor layers. The second conductive type semiconductor layer 2*a*5, the fourth conductive type semiconductor layer 2*b*5, and the sixth conductive type semiconductor layer 2*c*5 are n-type semiconductor layers. Each of the first light-emitting material layer 2*a*4, the second light-emitting material layer 2*b*4, and the third light-emitting material layer 2*c*4 may have a multi-quantum well structure.

It will be appreciated that in some embodiments, the first conductive type semiconductor layer 2*a*3, the third conductive type semiconductor layer 2*b*3, and the fifth conductive type semiconductor layer 2*c*3 may be n-type semiconductor layers, and that the second conductive type semiconductor layer 2*a*5, the fourth conductive type semiconductor layer 2*b*5, and the sixth conductive type semiconductor layer 2*c*5 may be p-type semiconductor layers.

Optionally, the plurality of conductive pads further includes a fourth conductive pad 10*d*. The first common electrode 2*a*2, the second common electrode 2*b*2, and the third common electrode 2*c*2 are all electrically connected to the fourth conductive pad 10*d*.

The first bonding layer f1 is provided with a first opening v1, and a first conductive bonding part s1 is filled in the first opening v1. The first conductive bonding part s1 is connected to the fourth conductive pad 10*d*. The second bonding layer f2 is provided with a second opening v2, and a second conductive bonding part s2 is filled in the second opening v2. The second conductive bonding part s2 is connected to the first common electrode 2*a*2 and is bonded to the first conductive bonding part s1.

The third bonding layer f3 is provided with a third opening v3, which further extends through the first independent electrode 2*a*1, the second conductive type semiconductor layer 2*a*5, the first light-emitting material layer 2*a*4, and the first conductive type semiconductor layer 2*a*3. The third opening v3 is filled with a third conductive bonding part s3. The third conductive bonding part s3 is connected to the first common electrode 2*a*2. The fourth bonding layer f4 is provided with a fourth opening v4. The fourth opening v4 is filled with a fourth conductive bonding part s4. The fourth conductive bonding part s4 is connected to the second common electrode 2*b*2 and is bonded to the third conductive bonding part s3.

The fifth bonding layer f5 is provided with a fifth opening v5, which further extends through the second independent electrode 2*b*1, the fourth conductive type semiconductor layer 2*b*5, the second light-emitting material layer 2*b*4, and the third conductive type semiconductor layer 2*b*3. The fifth opening v5 is filled with a fifth conductive bonding part s5. The fifth conductive bonding part s5 is connected to the second common electrode 2*b*2. The sixth bonding layer f6 is provided with a sixth opening v6. The sixth opening v6 is filled with a sixth conductive bonding part s6. The sixth conductive bonding part s6 is connected to the third common electrode 2*c*2 and is bonded to the fifth conductive bonding part s5.

In the present embodiment, the conductive bonding parts are connected to the fourth conductive pad, the first common electrode 2*a*2, the second common electrode 2*b*2, and the third common electrode 2*c*2, respectively. The first common electrode 2*a*2 to the third common electrode 2*c*2 are all set flat to prevent the first common electrode 2*a*2 to the third common electrode 2*c*2 from being connected through via covering, thereby improving the stability of the electrical connections.

In the direction perpendicular to the panel surface of the display panel 100, the first opening v1 to the sixth opening v6 are all aligned so as to save space on the horizontal plane and improve the resolution.

Referring to FIG. 1, in the direction from the drive substrate 10 toward the third LED structure 2*c*, the width of the first opening v1 increases and the width of the second opening v2 decreases; the width of the third opening v3 increases, and the width of the fourth opening v4 decreases; the width of the fifth opening v5 increases, and the width of the sixth opening v6 decreases. That is, the width of the first conductive bonding part s1 increases, and the width of the second conductive bonding part s2 decreases; the width of the third conductive bonding part s3 increases, and the width of the fourth conductive bonding part s4 decreases; the width of the fifth conductive bonding part s5 increases, and the width of the sixth conductive bonding part s6 decreases.

That is, between the first conductive bonding part s1 and the second conductive bonding part s2, between the third conductive bonding part s3 and the fourth conductive bonding part s4, and between the fifth conductive bonding part s5 and the sixth conductive bonding part s6, wider ends are used to perform alignment bonding, thereby improving the success rate of bonding and the stability of bonding.

In addition, the width of the first opening v1 is slightly larger than the width of the second opening v2, the width of the third opening v3 is slightly larger than the width of the fourth opening v4, and the width of the fifth opening v5 is slightly larger than the width of the sixth opening v6, so as to compensate for alignment errors and improve accuracy and stability of bonding.

Optionally, a first insulating layer r1 is disposed between a portion of the first independent electrode 2*a*1 extending into the first through-hole g1 and a sidewall of the first through-hole g1 to avoid short-circuiting of the first independent electrode 2*a*1 and the first LED structure 2*a*.

A second insulating layer r2 is disposed between the second connecting part d2 and a sidewall of the third hollow hole k3 to avoid short-circuiting of the second connecting part d2 and the first LED structure 2*a*. A third insulating layer r3 is disposed between a portion of the second independent electrode 2*b*1 extending into the second through-hole g2 and a sidewall of the second through-hole g2 to avoid short-circuiting of the second independent electrode 2*b*1 and the second LED structure 2*b*.

A fourth insulating layer r4 is further disposed on sidewalls of the fourth connecting part d4 and the fifth hollow hole k5 to avoid short-circuiting of the fourth connecting part d4 and the first LED structure 2*a*. A fifth insulating layer r5 is disposed between the fifth connecting part d5 and a sidewall of the sixth hollow hole k6 to avoid short-circuiting of the fifth connecting part d5 and the second LED structure 2*b*. A sixth insulating layer r6 is disposed between a portion of the third independent electrode 2*c*1 extending into the third through-hole g3 and a sidewall of the third through-hole g3 to avoid short-circuiting of the third independent electrode 2*c*1 and the third LED structure 2*c*.

A seventh insulating layer r7 is disposed between the third conductive bonding part s3 and a sidewall of the third opening v3 to avoid short-circuiting of the third conductive bonding part s3 and the first LED structure 2*a*. An eighth insulating layer r8 is disposed between the fifth conductive bonding part s5 and a sidewall of the fifth opening v5 to avoid short-circuiting of the fifth conductive bonding part s5 and the second LED structure 2*b*.

It will be appreciated that in some embodiments, the connection in one of the following groups is through bonding: the drive substrate 10 and the first LED structure 2*a*, the first LED structure 2*a* and the second LED structure 2*b*, and the second LED structure 2*b* and the third LED structure 2*c*; and the other groups may adopt a direct formation manner. For example, the first LED structure 2*a* is formed directly on the drive substrate 10, the third LED structure 2*c* is formed directly on the second LED structure 2*b*, and the second LED structure 2*b* is bonded onto the first LED structure.

In some embodiments, the connections in two of the following groups is through bonding: the drive substrate 10 and the first LED structure 2*a*, the first LED structure 2*a* and the second LED structure 2*b*, and the second LED structure 2*b* and the third LED structure 2*c*; and the other group may adopt a direct formation manner. For example, the first LED structure 2*a* is bonded onto the drive substrate 10, the third LED structure 2*c* is directly formed on the second LED structure 2*b*, and the second LED structure 2*b* is bonded onto the first LED structure 2*a*.

Optionally, the display panel 100 further includes a first Bragg reflective layer 2*e*1 and a second Bragg reflective layer 2*e*2. The first Bragg reflective layer 2*e*1 is disposed between the fourth bonding layer f4 and the second common electrode 2*b*2. The fourth opening v4 extends through the first Bragg reflective layer 2*e*1. The first Bragg reflective layer 2*e*1 is configured to reflect light emitted by the second LED structure 2*b* and transmit light emitted by the first LED structure 2*a*.

The second Bragg reflective layer 2*e*2 is disposed between the sixth bonding layer f6 and the third common electrode 2*c*2. The sixth opening v6 extends through the second Bragg reflective layer 2*e*2. The second Bragg reflective layer 2*e*2 is configured to reflect light emitted by the third LED structure 2*c* and transmit light emitted by the first LED structure 2*a* and the second LED structure 2*b*.

As such, light generated from the first LED structure 2*a* may be emitted to the outside through the second LED structure 2*b* and the third LED structure 2*c*, and light generated from the second LED structure 2*b* may be emitted to the outside through the third LED structure 2*c*. In addition, it is possible to prevent the light generated from the second LED structure 2*b* from being lost due to incidence into the first LED structure 2*a*, or to prevent the light generated from the third LED structure 2*c* from being lost due to incidence into the second LED structure 2*a*.

The Bragg reflective layer may be formed by alternately stacking a high refractive index film layer(s) and a low refractive index film layer(s), and light of a specific wavelength may be reflected by adjusting the refractive index(es) and the thickness(es) of the film layer(s).

Based on the above structure, given a same area, four groups of overlapping apertures (through-holes, hollow holes and openings) are provided in the first LED structure 2*a*, three groups of overlapping apertures are provided in the second LED structure 2*b*, and two groups of overlapping apertures are provided in the third LED structure 2*c*. Therefore, the light-emitting area of the first LED structure 2*a* is smaller than that of the second LED structure 2*b*, and the light-emitting area of the second LED structure 2*b* is smaller than that of the third LED structure 2*c*.

Since the first LED structure 2*a* emits red light, the second LED structure 2*b* emits green light, and the third LED structure 2*c* emits blue light, the luminance per unit area of the blue light is the lowest, and the luminance per unit area of the red light is the highest, therefore, the first LED structure 2*a* is provided with the most groups of apertures, and the third LED structure 2*c* is provided with the least groups of apertures to adjust the light-emitting areas of the three, thereby improving the uniformity of the luminance emittance of the display panel 100.

The anodes of the first LED structure 2*a*, the second LED structure 2*b*, and the third LED structure 2*c* are commonly electrically connected to the fourth conductive pad 10*d*, and the cathodes of the first LED structure 2*a*, the second LED structure 2*b*, and the third LED structure 2*c* are electrically connected to the first conductive pad 10*a*, the second conductive pad 10*b*, and the third conductive pad 10*c*, respectively, which conductive pads are different from each other. Therefore, the first to third LED structures 2*a*, 2*b*, and 2*c* may be independently driven.

The LED structures 2*a*, 2*b*, and 2*c* may be disposed on the drive substrate 10, and may be electrically connected to an internal circuitry of the drive substrate 10 so as to be driven in an active matrix manner.

Figure 2:
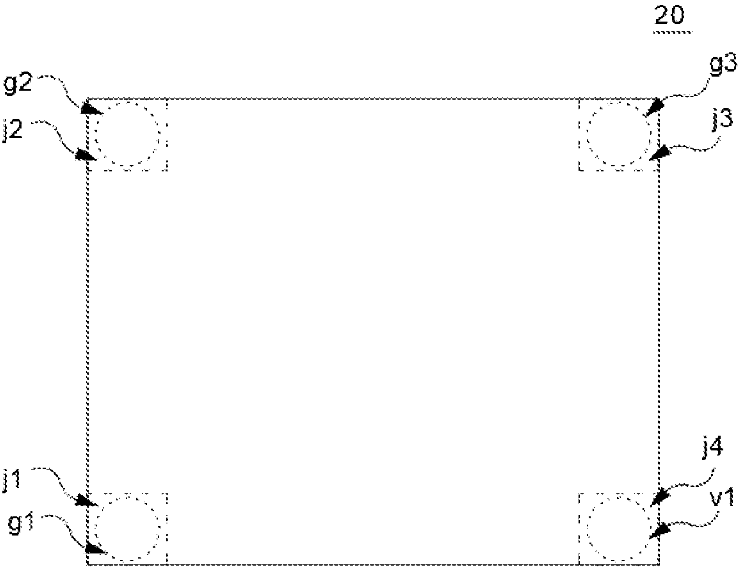
FIG. 2 is a schematic top view of a structure of a pixel of a display panel according to an embodiment of the present disclosure.

Referring to FIG. 2, the pixel 20 has a first corner area j1, a second corner area j2, a third corner area j3, and a fourth corner area j4. In the orthographic projection of the display panel 100, the first through-hole g1 is disposed in the first corner area j1, the second through-hole g2 is disposed in the second corner area j2, the third through-hole g3 is disposed in the third corner area j3, and the first opening v1 is disposed in the fourth corner area j4.

The first through-hole g1 is aligned with the first hollow hole k1 to form the first set of holes. The second through-hole g2, the second hollow hole k2, and the third hollow hole k3 are aligned to form a second set of holes. The third through-hole g3, the fourth hollow hole k4, the fifth hollow hole k5, and the sixth hollow hole k6 are aligned to form a third set of holes. The first opening v1 to the sixth opening v6 are all aligned to form a fourth set of holes. Therefore, the four set of holes are each disposed in a respective corner area of the pixel 20 in a one-to-one correspondence, thereby reducing the influence of the sets of holes on the light emission from the first LED structure to the third LED structures 2*a*, 2*b* and 2*c*.

It should be noted that the manufacturing process of the display panel 100 of the present embodiment includes the following steps.

Figure 3:
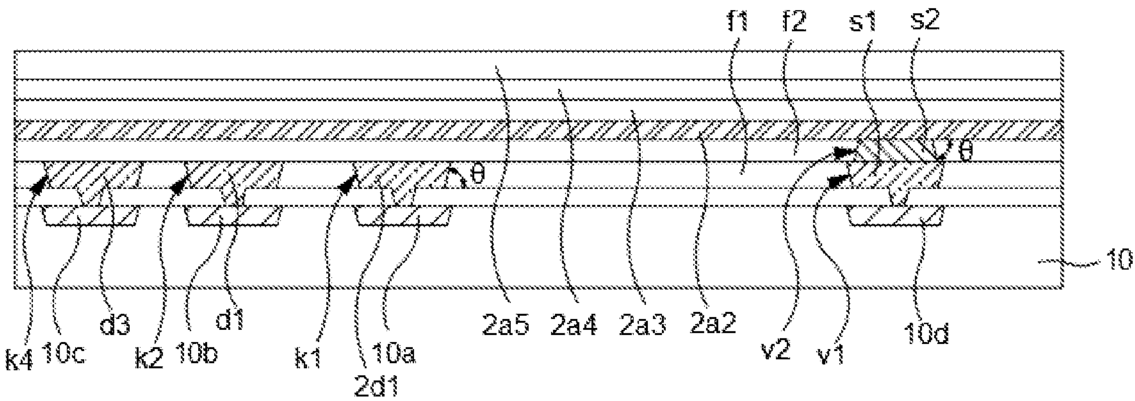
FIG. 3 is a schematic diagram of a structure provided by step S1 of a method for preparing a display panel according to an embodiment of the present disclosure.

Referring to FIG. 3, at step S1, a first bonding layer f1 is formed on a drive substrate 10. A first opening v1, a first hollow hole k1, a second hollow hole k2, and a fourth hollow hole k4 are formed by patterning the first bonding layer f1. The first opening v1 exposes a fourth conductive pad (common anode) 10*d*, the first hollow hole k1 exposes a first conductive pad (first cathode) 10*a*, the second hollow hole k2 exposes a second conductive pad (second cathode) 10*b*, and the fourth hollow hole k4 exposes a third conductive pad (third cathode) 10*c*. Subsequently, a first metal layer is formed on the first bonding layer f1. The first metal layer covers the first bonding layer f1 and fills the first opening v1, the first hollow hole k1, the second hollow hole k2, and the fourth hollow hole k4. Next, the first metal layer is ground to remove the first metal layer except for its portions in the first opening v1, the first hollow hole k1, the second hollow hole k2, and the fourth hollow hole k4, forming the first conductive bonding part s1, the first electrical switching member 2*d*1, the first connecting part d1, and the third connecting part d3 that are flush with the first bonding layer f1.

Step S1 further includes forming a second bonding layer f2 on a side of the first LED having a first backplane adjacent to the drive substrate 10, patterning the second bonding layer f2 to form a second opening v2 which exposes the first common electrode 2*a*2; subsequently, forming a second metal layer on the second bonding layer f2 to cover the second bonding layer f2 and fill the second opening v2; and next, grounding the second metal layer to remove the second metal layer except for its portion in the second opening v2, forming the second conductive bonding part s2 that is flush with the second bonding layer f2.

Optionally, the grinding is carried out using a chemical-mechanical polishing (CMP) process. The first metal layer and the second metal layer are ground in an over-grinding manner. That is, in addition to grinding off the first metal layer on the upper surface of the first bonding layer f1 and the second metal layer on the lower surface of the second bonding layer f2, a small portion of the first bonding layer f1 and a small portion of the second bonding layer f2 are ground off, so that the stability of bonding of the first bonding layer f1 and the second bonding layer f2 is improved when subsequent bonding is performed.

Step ST further includes bonding the first LED and the drive substrate 10 such that the first bonding layer f1 is bonded to the second bonding layer f2, and the first conductive bonding part s1 is bonded to the second conductive bonding part s2; and next, removing the first backplane to expose the second conductive type semiconductor layer 2*a*5 of the first LED.

Optionally, the thicknesses of the first bonding layer f1 and the second bonding layer f2 after grinding are greater than or equal to 1000 Angstroms, for example, 1000 Angstroms, 1500 Angstroms, or 2000 Angstroms, for assisting the bonding process.

The first metal layer and the second metal layer each have a thickness greater than 1000 Angstroms, so that the first metal layer fills at least the first opening v1, the first hollow hole k1, the second hollow hole k2, and the fourth hollow hole k4, and the second metal layer fills at least the second opening v2.

The thickness of each of the first metal layer and the second metal layer may be 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc.

The first opening v1, the second opening v2, the first hollow hole k1, the second hollow hole k2, and the fourth hollow hole k4 each have a size of less than or equal to 1 micron, for example, 1 micron, 0.9 microns, 0.8 microns, 0.7 microns, 0.6 microns, 0.5 microns, 0.4 microns, 0.3 microns, or 0.2 microns. The size refers to the length and the width, i.e., the length and the width of the above openings are both less than or equal to 1 micron, so as to reduce the influence of the openings on the light-emitting area of the LED.

The first opening v1, the second opening v2, the first hollow hole k1, the second hollow hole k2, and the fourth hollow hole k4 each have a slope angle θ greater than or equal to 85 degrees and less than or equal to 90 degrees.

Figure 4:
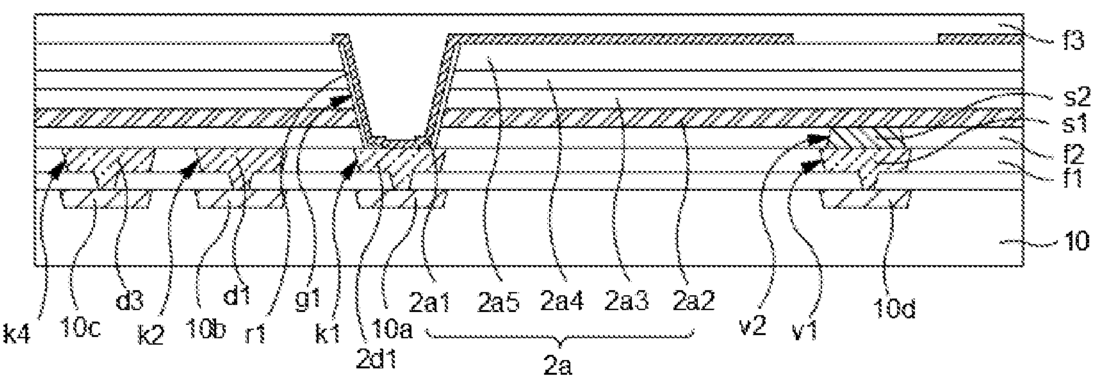
FIG. 4 is a schematic diagram of a structure provided by step S2 of a method for preparing a display panel according to an embodiment of the present disclosure.

Referring to FIG. 4, at step S2, the first LED is patterned to form a first through-hole g1 exposing the first electrical switching member 2*d*1. Then, a first insulating layer r1 exposing the first electrical switching member 2*d*1 is formed on a hole wall of the first through-hole g1. Next, a patterned first independent electrode 2*a*1 is formed on the first LED, and the first independent electrode 2*a*1 is connected to the first electrical switching member 2*d*1 through the first through-hole g1 to form the first LED structure 2*a*. Subsequently, a third bonding layer f3 filling the first through-hole g1 and covering the first independent electrode 2*a*1 is formed on the first independent electrode 2*a*1. Subsequently, the third bonding layer f3 is thinned using a CMP process.

Optionally, the size of the first through-hole g1 is less than or equal to 1 micron, for example, 1 micron, 0.9 microns, 0.8 microns, 0.7 microns, 0.6 microns, 0.5 microns, 0.4 microns, 0.3 microns or 0.2 microns.

The thickness of each of the first independent electrode 2*a*1 and the first common electrode 2*a*2 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the first independent electrode 2*a*1 and the second common electrode 2*a*2.

The thickness of the thinned third bonding layer f3 (not the thickness at the first through-hole g1) is greater than or equal to 3000 Angstroms, for example, 3000 Angstroms, 3100 Angstroms, 3200 Angstroms, 3300 Angstroms, 3400 Angstroms, 3500 Angstroms, 3600 Angstroms, 3700 Angstroms, 3800 Angstroms, 3900 Angstroms, 4000 Angstroms, 4500 Angstroms, or 5000 Angstroms, etc. The thinned third bonding layer f3 has a thickness greater than or equal to 3000 Angstroms to ensure that the third bonding layer f3 has a minimum bonding thickness after the subsequent grinding step.

Figure 5:
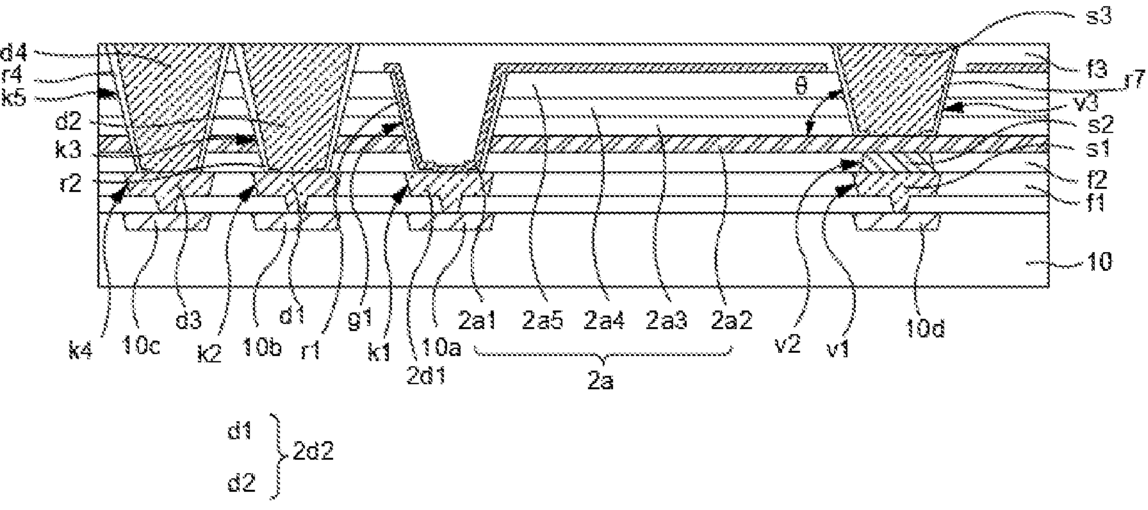
FIG. 5 is a schematic diagram of a structure provided by step S3 of a method for preparing a display panel according to an embodiment of the present disclosure.

Referring to FIG. 5, at step S3, the third bonding layer f3 is patterned to form a third opening v3, a third hollow hole k3, and a fifth hollow hole k5, where the third opening v3 exposes the first common electrode 2*a*2, the third hollow hole k3 exposes the first connecting part d1, and the fifth hollow hole k5 exposes the third connecting part d3. A seventh insulating layer r7 is formed on a sidewall of the third opening v3, a second insulating layer r2 is formed on a sidewall of the third hollow hole k3, and a fourth insulating layer r4 is formed on a sidewall of the fifth hollow hole k5. Subsequently, a third metal layer is formed on the third bonding layer f3, the third metal layer fills at least the third opening v3, the third hollow hole k3, and the fifth hollow hole k5, and covers the third bonding layer 3. Subsequently, the third metal layer is ground, and the third metal layer except for its portions in the third opening v3, the third hollow hole k3, and the fifth hollow hole k5 is removed to form the third conductive bonding part s3, the second connecting part d2, and the fourth connecting part d4 that are flush with the third bonding layer 3.

Optionally, the grinding is carried out using a chemical-mechanical polishing (CMP) process. The third metal layer is ground in an over-grinding manner. That is, in addition to grinding off the third metal layer on the upper surface of the third bonding layer f3, a small portion of the third bonding layer f3 is ground off, thereby improving the stability of subsequent bonding.

The third opening v3, the third hollow hole k3, and the fifth hollow hole k5 each have a size of less than or equal to 1 micron, for example, 1 micron, 0.9 microns, 0.8 microns, 0.7 microns, 0.6 microns, 0.5 microns, 0.4 microns, 0.3 microns, or 0.2 microns.

Each of the third opening v3, the third hollow hole k3, and the fifth hollow hole k5 has a slope angle greater than or equal to 85 degrees and less than or equal to 90 degrees.

The thickness of the third bonding layer f3 after grinding is greater than or equal to 1000 Angstroms, for example, 1000 Angstroms, 1500 Angstroms, or 2000 Angstroms, for assisting the bonding process.

Figure 6:
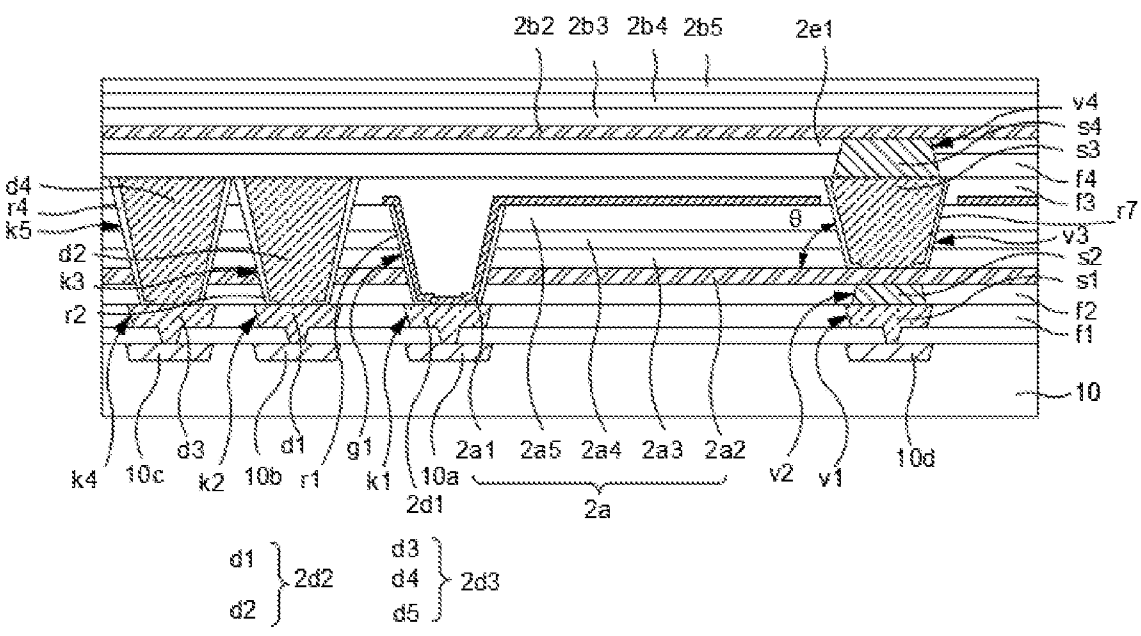
FIG. 6 is a schematic diagram of a structure provided by step S4 of a method for preparing a display panel according to an embodiment of the present disclosure.

Referring to FIG. 6, at step S4, a first Bragg reflective layer 2_e_1 and a fourth bonding layer f4 are sequentially formed on a surface of a second LED having a second backplane adjacent to the drive substrate 10, the fourth bonding layer f4 is patterned to form a fourth opening v4, and the fourth opening v4 exposes the second common electrode 2_b_2. Subsequently, a fourth metal layer is formed on the fourth bonding layer f4, and the fourth metal layer covers the fourth bonding layer f4 and fills the fourth opening v4. Next, the fourth metal layer is ground, and the fourth metal layer except for its portion in the fourth opening v4 is removed to form a fourth conductive bonding part s4 that is flush with the fourth bonding layer f4.

Step S4 further includes bonding the second LED and the first LED structure 2_a_ such that the third bonding layer f3 is bonded to the fourth bonding layer f4 and the third conductive bonding part s3 is bonded to the fourth conductive bonding part s4; and next, removing the second backplane to expose the fourth conductive type semiconductor layer 2_b_5 of the second LED.

Optionally, the thickness of the fourth bonding layer f4 after grinding is greater than or equal to 1000 Angstroms, for example, 1000 Angstroms, 1500 Angstroms, or 2000 Angstroms, for assisting the bonding process.

The thickness of the fourth metal layer is greater than the depth of the fourth opening v4.

The size of the fourth opening v4 is less than or equal to 1 micron, for example, 1 micron, 0.9 microns, 0.8 microns, 0.7 microns, 0.6 microns, 0.5 microns, 0.4 microns, 0.3 microns, or 0.2 microns. The slope angle of the fourth opening v4 is greater than or equal to 85 degrees and less than or equal to 90 degrees.

Figure 7:
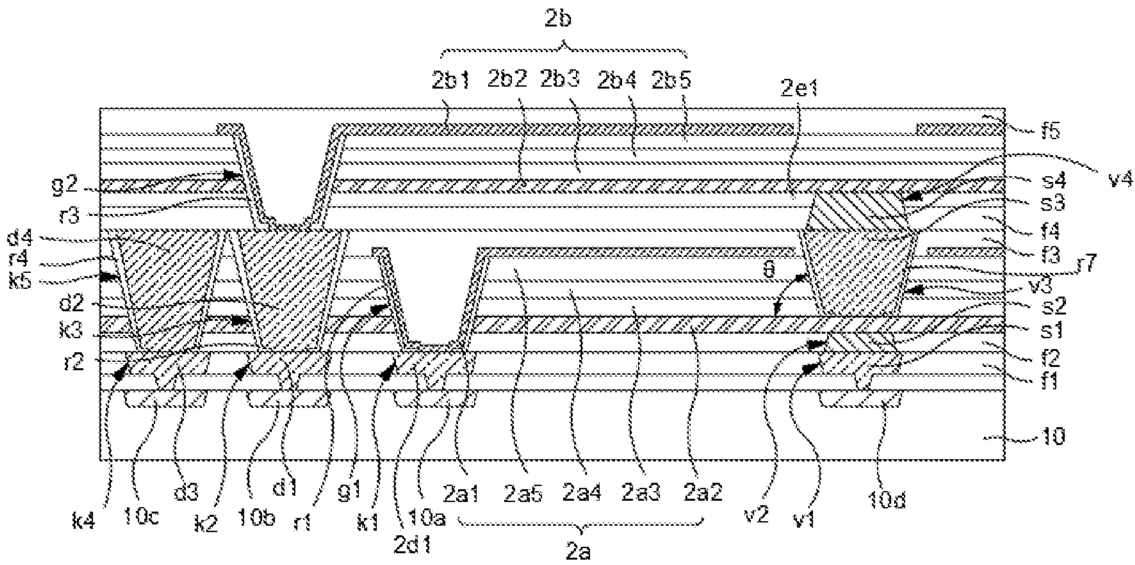
FIG. 7 is a schematic diagram of a structure provided by step S5 of a method for preparing a display panel according to an embodiment of the present disclosure.

Referring to FIG. 7, at step S5, the second LED is patterned to form a second through-hole g2 exposing the second connecting part d2. Then, a third insulating layer r3 exposing the second connecting part d2 is formed on a hole wall of the second through-hole g2. Next, a patterned second independent electrode 2_b_1 is formed on the second LED, and the second independent electrode 2_b_1 is connected to the second connecting part d2 through the second through-hole g2 to form the second LED structure 2_b_. Subsequently, a fifth bonding layer f5 filling the second through-hole g2 and covering the second independent electrode 2_b_1 is formed on the second independent electrode 2_b_1. Subsequently, the fifth bonding layer f5 is thinned by a CMP process.

Optionally, the size of the second through-hole g2 is less than or equal to 1 micron, for example, 1 micron, 0.9 microns, 0.8 microns, 0.7 microns, 0.6 microns, 0.5 microns, 0.4 microns, 0.3 microns, or 0.2 microns.

The thickness of each of the second common electrode 2_b_2 and the second independent electrode 2_b_1 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the second common electrode 2_b_2 and the second independent electrode 2_b_1.

The thickness of the thinned fifth bonding layer f5 (not the thickness at the second through-hole g2) is greater than or equal to 3000 Angstroms, and may be for example, 3000 Angstroms, 3100 Angstroms, 3200 Angstroms, 3300 Angstroms, 3400 Angstroms, 3500 Angstroms, 3600 Angstroms, 3700 Angstroms, 3800 Angstroms, 3900 Angstroms, 4000 Angstroms, 4500 Angstroms, or 5000 Angstroms, etc. The thinned fifth bonding layer f5 has a thickness greater than or equal to 3000 Angstroms to ensure that the fifth bonding layer f5 has a minimum bonding thickness after the subsequent grinding step.

Figure 8:
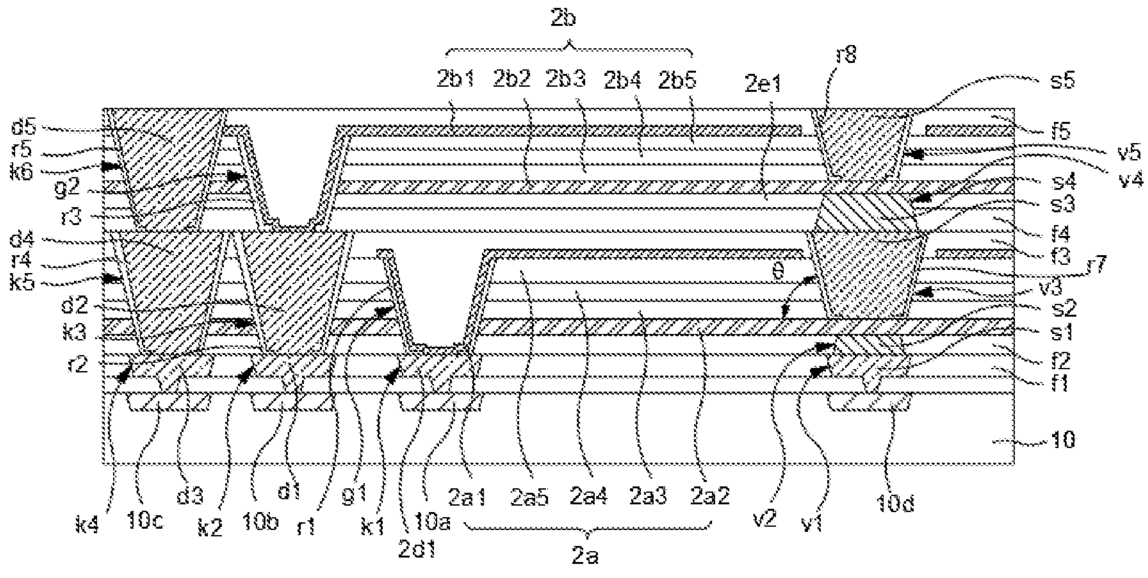
FIG. 8 is a schematic diagram of a structure provided by step S6 of a method for preparing a display panel according to an embodiment of the present disclosure.

Referring to FIG. 8, at step S6, the fifth bonding layer f5 is patterned to form a fifth opening v5 exposing the second common electrode 2_b_2 and a sixth hollow hole k6 exposing the fourth connecting part d4. An eighth insulating layer r8 is formed on a sidewall of the fifth opening v5. Subsequently, a fifth metal layer filling at least the fifth opening v5 and the sixth hollow hole k6 and covering the fifth bonding layer f5 is formed on the fifth bonding layer f5. Subsequently, the fifth metal layer is ground off, and the fifth metal layer except for its portions in the fifth opening v5 and the sixth hollow hole k6 is removed to form the fifth conductive bonding part s5 and the fifth electrical connecting part d5 that are flush with the fifth bonding layer f5.

Optionally, the grinding is carried out using a chemical-mechanical polishing (CMP) process. The fifth metal layer is ground in an over-grinding manner. That is, in addition to grinding off the fifth metal layer on the upper surface of the fifth bonding layer f5, a small portion of the fifth bonding layer f5 is ground off, thereby improving the stability of subsequent bonding.

The fifth opening v5 and the sixth hollow hole k6 each have a size of less than or equal to 1 micron, for example, 1 micron, 0.9 microns, 0.8 microns, 0.7 microns, 0.6 microns, 0.5 microns, 0.4 microns, 0.3 microns, or 0.2 microns.

The fifth opening v5 and the sixth hollow hole k6 each have a slope angle greater than or equal to 85 degrees and less than or equal to 90 degrees.

The thickness of the fifth bonding layer f5 after grinding is greater than or equal to 1000 Angstroms, for example, 1000 Angstroms, 1500 Angstroms, or 2000 Angstroms, for assisting the bonding process.

Figure 9:
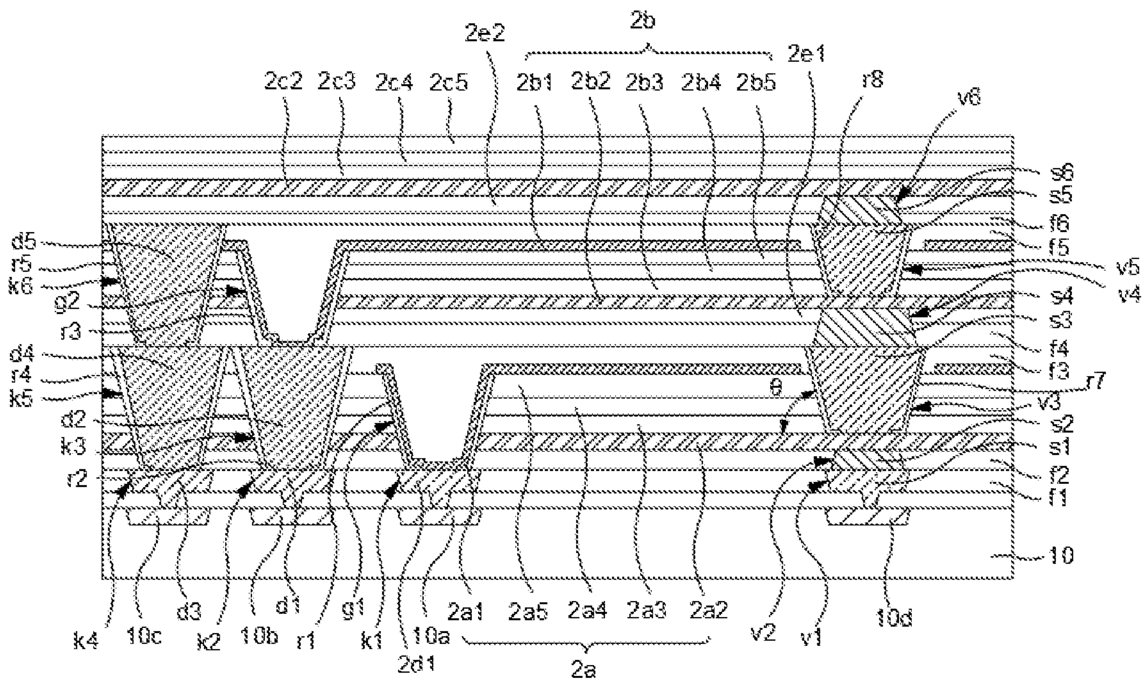
FIG. 9 is a schematic diagram of a structure provided by step S7 of a method for preparing a display panel according to an embodiment of the present disclosure.

Referring to FIG. 9, at step S7, a second Bragg reflective layer 2_e_2 and a sixth bonding layer f6 are sequentially formed on a surface of a third LED having a third backplane adjacent to the drive substrate 10. The sixth bonding layer f6 is patterned to form a sixth opening v6, and the sixth opening v6 exposes the third common electrode 2_c_2. Subsequently, a sixth metal layer is formed on the sixth bonding layer f6, and the sixth metal layer covers the sixth bonding layer f6 and fills the sixth opening v6. Next, the sixth metal layer is ground off, and the sixth metal layer except for its portion in the sixth opening v6 is removed to form the sixth conductive bonding part s6 that is flush with the sixth bonding layer f6.

Step S7 further includes bonding the third LED and the second LED structure 2_b_ such that the fifth bonding layer f5 is bonded to the sixth bonding layer f6 and the fifth conductive bonding part s5 is bonded to the sixth conductive bonding part s6; and next, removing the third backplane to expose the sixth conductive type semiconductor layer 2c5 of the third LED.

Optionally, the thickness of the sixth bonding layer f6 after grinding is greater than or equal to 1000 Angstroms, for example, 1000 Angstroms, 1500 Angstroms, or 2000 Angstroms, for assisting the bonding process.

The thickness of the sixth metal layer is greater than the depth of the sixth opening v6.

The size of the sixth opening v6 is less than or equal to 1 micron, for example, 1 micron, 0.9 microns, 0.8 microns, 0.7 microns, 0.6 microns, 0.5 microns, 0.4 microns, 0.3 microns, or 0.2 microns. The slope angle of the sixth opening v6 is greater than or equal to 85 degrees and less than or equal to 90 degrees.

Figure 10:
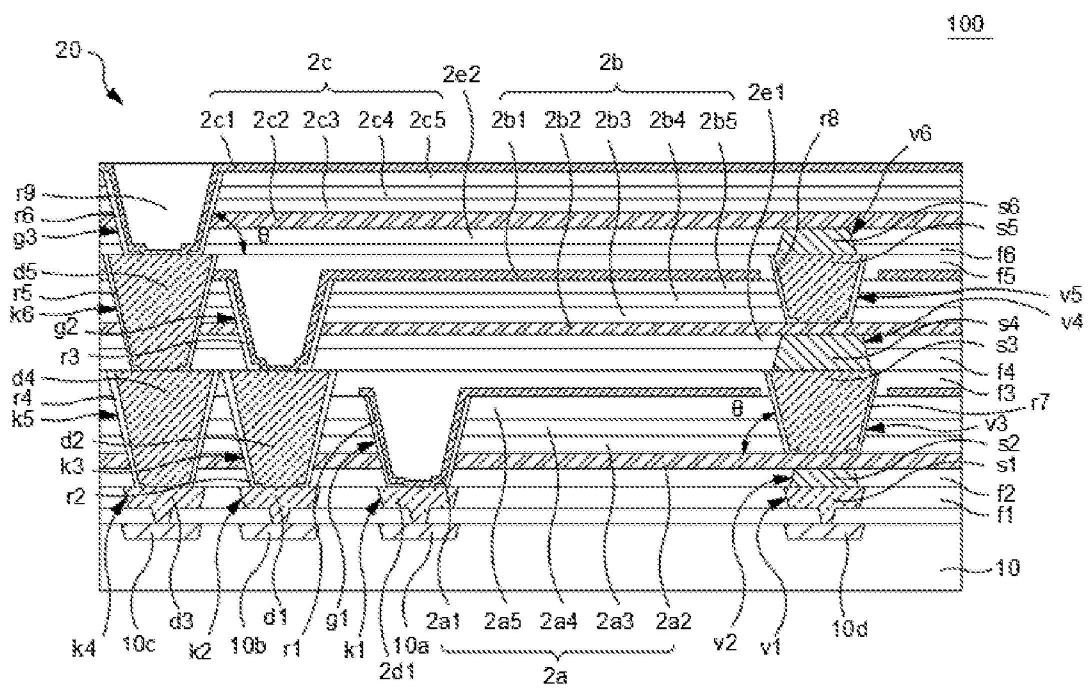
FIG. 10 is a schematic diagram of a structure provided by step S8 of a method for preparing a display panel according to an embodiment of the present disclosure.

Referring to FIG. 10, at step S8, the third LED is patterned to form a third through-hole g3 exposing the fifth connecting part d5. Then, a sixth insulating layer r6 exposing the fifth connecting part d5 is formed on a hole wall of the third through-hole g3. Next, a patterned third independent electrode 2c1 is formed on the third LED, and the third independent electrode 2c1 is connected to the fifth connecting part d5 through the third through-hole g3 to form the third LED structure 2c.

Optionally, step S8 further includes filling the third through-hole g3 with a protective layer r9 so that the protective layer r9 is flush with the third independent electrode 2c1. The material of the protective layer r9 is an insulating material.

The first LED structure 2a, the second LED structure 2b, and the third LED structure 2c are stacked to form a pixel 20.

Optionally, the size of the third through-hole g3 is less than or equal to 1 micron, for example, 1 micron, 0.9 microns, 0.8 microns, 0.7 microns, 0.6 microns, 0.5 microns, 0.4 microns, 0.3 microns, or 0.2 microns.

The thickness of each of the third common electrode 2c2 and the third independent electrode 2c1 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the third common electrode 2c2 and the third independent electrode 2c1.

Figure 11:
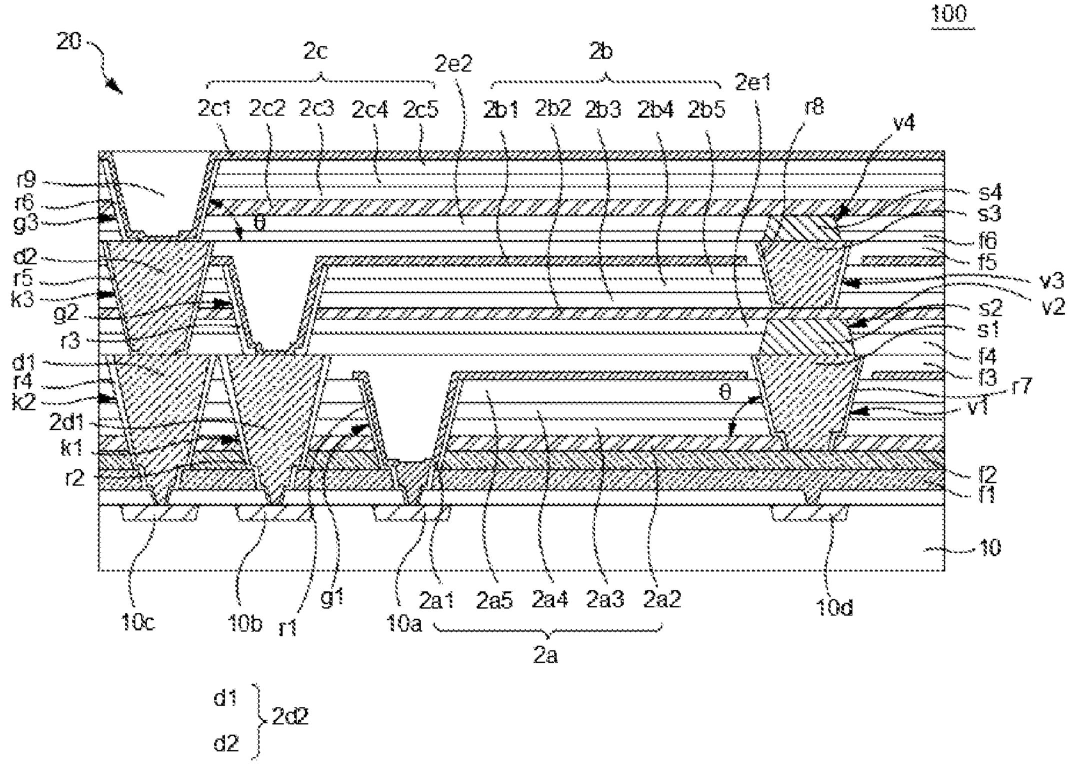
FIG. 11 is a schematic diagram of another structure of a display panel according to an embodiment of the present disclosure.

Referring to FIG. 11, embodiments of the present disclosure provides another display panel 100 including a drive substrate 10 and a plurality of pixels 20. The plurality of pixels 20 are disposed on the drive substrate 10.

The drive substrate 10 includes a plurality of conductive pads disposed at intervals. Each pixel 20 includes a first LED structure 2a, a second LED structure 2b, and a third LED structure 2c disposed in a stack. The pixel 20 further includes at least one electrical switching member. The at least one electrical switching member is disposed on a side of the third LED structure 2c adjacent to the drive substrate 10. One of the at least one electrical switching member is correspondingly connected to and disposed on one of the conductive pads.

The first LED structure 2a is disposed on the drive substrate 10. The first LED structure 2a includes a first independent electrode 2a1 located on a side away from the drive substrate 10. The first independent electrode 2a1 is electrically connected to one of the conductive pads.

The wavelength of light emitted by the second LED structure 2b is smaller than the wavelength of light emitted by the first LED structure 2a. The second LED structure 2b is disposed on a side of the first LED structure 2a away from the drive substrate 10. The second LED structure 2b includes a second independent electrode 2b1 located on a side away from the first LED structure 2a. The second independent electrode 2b1 is electrically connected to another one of the conductive pads.

The wavelength of light emitted by the third LED structure 2c is smaller than the wavelength of light emitted by the second LED structure 2b. The third LED structure 2c is disposed on a side of the second LED structure 2b away from the drive substrate 10. The third LED structure 2c includes a third independent electrode 2c1 located on a side away from the second LED structure 2b. The second independent electrode 2c1 is electrically connected to yet another one of the conductive pads.

At least one of the first independent electrode 2a1, the second independent electrode 2b1, and the third independent electrode 2c1 is connected to one of the at least one electrical switching member through a through-hole. In a direction perpendicular to the panel surface of the display panel 100, the through-hole is disposed to overlap with the electrical switching member.

According to the display panel 100 of the embodiment of the present disclosure, an electrical switching member is provided between at least one of the first independent electrode 2a1, the second independent electrode 2b1, and the third independent electrode 2c1 and a corresponding conductive pad, so that the depth of a through-hole is reduced, thereby reducing the size of the through-hole, which in turn improves the resolution and reduces the risk that independent electrode(s) is easily broken in the through-hole.

Optionally, the drive substrate 10 may be a drive substrate in which thin-film transistors are formed.

Optionally, the first LED structure 2a may be an inorganic light-emitting diode structure configured to emit red light, the second LED structure 2b may be an inorganic light-emitting diode structure configured to emit green light, and the third LED structure 2c may be an inorganic light-emitting diode structure configured to emit blue light.

The color of light each of the first LED structure 2a, the second LED structure 2b, and the third LED structure 2c emits may be adjusted according to actual requirements.

Optionally, the material of the electrical switching member(s) may be a metal or metal alloy, such as at least one of copper, gold, silver, tin, nickel, gold-tin alloy, and nickel-tin alloy.

The present embodiment is explained by taking the pixel 20 having two electrical switching members as an example. In some embodiments, the number of the electrical switching member(s) may be one, that is, one of the first independent electrode 2a1, the second independent electrode 2b1, and the third independent electrode 2c1 is connected to an electrical switching member through a through-hole. In addition, the number of the electrical switching members may be two, and of the first independent electrode 2a1, the second independent electrode 2b1, and the third independent electrode 2c1 are each connected to an electrical switching member through a through-hole.

Optionally, the display panel 100 further includes a first bonding layer f1 and a second bonding layer f2. The materials of the first bonding layer f1 and the second bonding layer f2 are both metal materials. The first bonding layer f1 is connected to and disposed on a surface of the drive substrate 10 adjacent to the first LED structure 2a, and the second bonding layer f2 is connected to and disposed on a surface of the first LED structure 2a adjacent to the drive substrate 10. The first bonding layer f1 is bonded to the second bonding layer f2.

The first LED structure 2*a* includes a first common electrode 2*a*2, a first conductive type semiconductor layer 2*a*3, a first light-emitting material layer 2*a*4, a second conductive type semiconductor layer 2*a*5, and a first independent electrode 2*a*1, which are sequentially stacked on a surface of the second bonding layer f2 away from the drive substrate 10.

The plurality of conductive pads includes a first conductive pad 10*a*. The through-hole(s) includes a first through-hole g1 provided in the first LED structure 2*a*. The first through-hole g1 extends through the second conductive type semiconductor layer 2*a*5, the first light-emitting material layer 2*a*4, the first conductive type semiconductor layer 2*a*3, the first common electrode 2*a*2, the second bonding layer f2, and the first bonding layer f1 and exposes the first conductive pad 10*a*. The first independent electrode 2*a*1 extends over the first through-hole g1 and is connected to the first conductive pad 10*a*.

Optionally, the display panel 100 further includes a third bonding layer f3 and a fourth bonding layer f4. The materials of the third bonding layer f3 and the fourth bonding layer f4 are both insulating materials. The third bonding layer f3 is connected to and disposed on a surface of the first LED structure 2*a* adjacent to the second LED structure 2*b*. The fourth bonding layer f4 is connected to and disposed on a surface of the second LED structure 2*b* adjacent to the drive substrate 10. The third bonding layer f3 is bonded to the fourth bonding layer f4.

The second LED structure 2*b* includes a second common electrode 2*b*2, a third conductive type semiconductor layer 2*b*3, a second light-emitting material layer 2*b*4, a fourth conductive type semiconductor layer 2*b*5, and a second independent electrode 2*b*1, which are sequentially stacked on a surface of the fourth bonding layer f4 away from the drive substrate 10.

The plurality of conductive pads includes a second conductive pad 10*b*. The at least one electrical switching member includes a first electrical switching member 2*d*1. The first LED structure 2*a* is provided with a first hollow hole k1. The first hollow hole k1 extends through the third bonding layer f3, the second conductive type semiconductor layer 2*a*5, the first light-emitting material layer 2*a*4, the first conductive type semiconductor layer 2*a*3, the first common electrode 2*a*2, the second bonding layer f2, and the first bonding layer f1 and exposes the second conductive pad 10*b*. The first electrical switching member 2*d*1 is filled in the first hollow hole k1 and is connected to the second conductive pad 10*b*.

The through-hole(s) includes a second through-hole g2 provided in the second LED structure 2*b*. The second through-hole g2 extends through the fourth conductive type semiconductor layer 2*b*5, the second light-emitting material layer 2*b*4, the third conductive type semiconductor layer 2*b*3, the second common electrode 2*b*2, and the fourth bonding layer f4. The second independent electrode 2*b*1 extends over the second through-hole g2 and is connected to the first electrical switching member 2*d*1.

In the present embodiment, the second independent electrode 2*b*1 extends into the second through-hole g2 and is connected to the first electrical switching member 2*d*1. That is, the second independent electrode 2*b*1 is connected to the second conductive pad 10*b* of the drive substrate 10 through the first electrical switching member 2*d*1, so that the depth of the second through-hole g2 is reduced, and the planar size of the second through-hole g2 is reduced. The depth of hole wall is shortened, and therefore the portion of the second independent electrode 2*b*1 covering the hole wall of the second through-hole g2 is shortened, thereby reducing the risk that the second independent electrode 2*b*1 is easily broken at the second through-hole g2.

Optionally, the display panel 100 further includes a fifth bonding layer f5 and a sixth bonding layer f6. The materials of the fifth bonding layer f5 and the sixth bonding layer f6 are both insulating materials. The fifth bonding layer f5 is connected to and disposed on a surface of the second LED structure 2*b* adjacent to the third LED structure 2*c*. The sixth bonding layer f6 is connected to and disposed on a surface of the third LED structure 2*c* adjacent to the drive substrate 10. The fifth bonding layer f5 is bonded to the sixth bonding layer f6.

The third LED structure 2*c* includes a third common electrode 2*c*2, a fifth conductive type semiconductor layer 2*c*3, a third light-emitting material layer 2*c*4, a sixth conductive type semiconductor layer 2*c*5, and a third independent electrode 2*c*1, which are sequentially stacked on a surface of the sixth bonding layer f6 away from the drive substrate 10.

The plurality of conductive pads includes a third conductive pad 10*c*. The at least one electrical switching member includes a second electrical switching member 2*d*2 including a first connecting part d1 and a second connecting part d2. The first LED structure 2*a* is provided with a second hollow hole k2 which extends through the third bonding layer f3, the second conductive type semiconductor layer 2*a*5, the first light-emitting material layer 2*a*4, the first conductive type semiconductor layer 2*a*3, the first common electrode 2*a*2, the second bonding layer f2, and the first bonding layer f1 and exposes the third conductive pad 10*c*. The first connecting part d1 is filled in the second hollow hole k2 and is connected to the third conductive pad 10*c*. The second LED structure 2*b* is provided with a third hollow hole k3 which extends through the fifth bonding layer f5, the fourth conductive type semiconductor layer 2*b*5, the second light-emitting material layer 2*b*4, the third conductive type semiconductor layer 2*b*3, the second common electrode 2*b*2, and the fourth bonding layer f4 and exposes the first connecting part d1. The second connecting part d2 is filled in the third hollow hole k3 and is connected to the first connecting part d1.

The through-hole(s) includes a third through-hole g3 provided in the third LED structure 2*c*. The third through-hole g3 extends through the sixth conductive type semiconductor layer 2*c*5, the third light-emitting material layer 2*c*4, the fifth conductive type semiconductor layer 2*c*3, the third common electrode 2*c*2, and the sixth bonding layer f6. The third independent electrode 2*c*1 extends over the third through-hole g3 and is connected to the second connecting part d2.

In the present embodiment, the third independent electrode 2*c*1 extends into the third through-hole g3 and is connected to the second electrical switching member 2*d*2, that is, the third independent electrode 2*c*1 is connected to the third conductive pad 10*c* of the drive substrate 10 through the second electrical switching member 2*d*2, so that the depth of the third through-hole g3 is reduced, and the planar size of the third through-hole g3 is reduced. The depth of the hole wall is shortened, and therefore the portion of the third independent electrode 2*c*1 covering the hole wall of the third through-hole g3 is shortened, thereby reducing the risk that the third independent electrode 2*c*1 is easily broken at the third through-hole g3.

Optionally, the third bonding layer f3 to the sixth bonding layer f6 are all transparent organic layers or transparent inorganic layers. The organic layers may include at least one of SU8, poly (methyl methacrylate) (PMMA), polyimide, parylene, benzocyclobutene (BCB). The inorganic layers may include at least one of $Al_2O_3$, $SiO_2$, $SiN_x$.

The materials of the first bonding layer f1, the second bonding layer f2, the first electric connecting member 2*d*1, the first connecting part d1, and the second connecting part d2 are all metals or metal alloys, for example, may be at least one of copper, gold, silver, tin, nickel, gold-tin alloy, and nickel-tin alloy.

Optionally, in a direction perpendicular to the panel surface of the display panel 100, the second through-hole g2 and the first hollow hole k1 are aligned so as to save the hole-opening area of the second through-hole g2, thereby increasing the light-emitting area of the second LED structure 2*b*, and improving the resolution.

The third through-hole g3, the second hollow hole k2, and the third hollow hole k3 are aligned so as to save the hole-opening area of the third through-hole g3, thereby increasing the light-emitting area of the third LED structure 2*c*, and improving the resolution.

Optionally, the slope angle θ of each of the first through-hole g1 to the third through-hole g3 and the first hollow hole k1 to the third hollow hole k3 is between 85 degrees and 90 degrees, for example, 85 degrees, 86 degrees, 87 degrees, 88 degrees, 89 degrees, or 90 degrees.

In the present embodiment, the slope angle θ is set between 85 degrees and 90 degrees, so that the planar sizes of the through-holes and the hollow holes may be reduced, and the effective light-emitting area may be increased.

Optionally, the width of each of the first through-hole g1 to the third through-hole g3 and the first hollow hole k1 to the third hollow hole k3 is less than or equal to 1 micron, for example, 1 micron, 0.9 microns, 0.8 microns, 0.7 microns, 0.6 microns, 0.5 microns, 0.4 microns, 0.3 microns, or 0.2 microns.

In the present embodiment, the widths of the through-holes and the hollow holes are limited to 1 micron, so as to ensure that the LED structures have larger light-emitting areas, that is, to reduce the loss of the light-emitting areas of the LED structures.

Optionally, the first independent electrode 2*a*1 to the third independent electrode 2*c*1 and the first common electrode 2*a*2 to the third common electrode 2*c*2 are transparent conductive oxides, for example, $SnO_2$, $InO_2$, ITO, ZnO, IZO, and the like.

The first conductive type semiconductor layer 2*a*3, the third conductive type semiconductor layer 2*b*3, and the fifth conductive type semiconductor layer 2*c*3 are p-type semiconductor layers. The second conductive type semiconductor layer 2*a*5, the fourth conductive type semiconductor layer 2*b*5, and the sixth conductive type semiconductor layer 2*c*5 are n-type semiconductor layers. Each of the first light-emitting material layer 2*a*4, the second light-emitting material layer 2*b*4, and the third light-emitting material layer 2*c*4 may have a multi-quantum well structure.

It will be appreciated that in some embodiments, the first conductive type semiconductor layer 2*a*3, the third conductive type semiconductor layer 2*b*3, and the fifth conductive type semiconductor layer 2*c*3 may be n-type semiconductor layers. The second conductive type semiconductor layer 2*a*5, the fourth conductive type semiconductor layer 2*b*5, and the sixth conductive type semiconductor layer 2*c*5 may be p-type semiconductor layers.

Optionally, the plurality of conductive pads further includes a fourth conductive pad 10*d*. The first common electrode 2*a*2, the second common electrode 2*b*2, the third common electrode 2*c*2, and the second bonding layer f2 are all electrically connected to the fourth conductive pad 10*d*. The first bonding layer f1 is connected to the fourth conductive pad 10*d*.

The third bonding layer f3 is provided with a first opening v1 which further extends through the first independent electrode 2*a*1, the second conductive type semiconductor layer 2*a*5, the first light-emitting material layer 2*a*4, the first conductive type semiconductor layer 2*a*3, and the first common electrode 2*a*2. A first conductive bonding part s1 is filled in the first opening v1. The first conductive bonding part s1 is connected to the second bonding layer f2. A second opening v2 is provided in the fourth bonding layer f4. A second conductive bonding part s2 is fill is filled in the second opening v2. The second conductive bonding part s2 is connected to the second common electrode 2*b*2 and is bonded to the first conductive bonding part s1.

The fifth bonding layer f5 is provided with a third opening v3 which further extends through the second independent electrode 2*b*1, the fourth conductive type semiconductor layer 2*b*5, the second light-emitting material layer 2*b*4, and the third conductive type semiconductor layer 2*b*3. The third opening v3 is filled with a third conductive bonding part s3. The third conductive bonding part s3 is connected to the second common electrode 2*b*2. The sixth bonding layer f6 is provided with a fourth opening v4. The fourth opening v4 is filled with a fourth conductive bonding part s4. The fourth conductive bonding part s4 is connected to the third common electrode 2*c*2 and is bonded to the third conductive bonding part s3.

In the present embodiment, the conductive bonding parts are connected to the first common electrode 2*a*2, the second common electrode 2*b*2, and the third common electrode 2*c*2, respectively. The first common electrode 2*a*2 to the third common electrode 2*c*2 are all set flat to prevent the first common electrode 2*a*2 to the third common electrode 2*c*2 from being connected through via covering, thereby improving the stability of the electrical connection.

Optionally, in the direction perpendicular to the panel surface of the display panel 100, the first opening v1 to the fourth opening v4 are all aligned so as to save space on the horizontal plane and improve the resolution.

Referring to FIG. 11, in the direction from the drive substrate 10 toward the third LED structure 2*c*, the width of the first opening v1 increases and the width of the second opening v2 decreases; the width of the third opening v3 increases, and the width of the fourth opening v4 decreases. That is, the width of the first conductive bonding part s1 increases, and the width of the second conductive bonding part s2 decreases; the width of the third conductive bonding part s3 increases, and the width of the fourth conductive bonding part s4 decreases.

That is, between the first conductive bonding part s1 and the second conductive bonding part s2, and between the third conductive bonding part s3 and the fourth conductive bonding part s4, wider ends are used to perform alignment bonding, thereby improving the success rate of bonding and the stability of bonding.

In addition, the width of the first opening v1 is slightly larger than the width of the second opening v2, and the width of the third opening v3 is slightly larger than the width of the fourth opening v4, so as to compensate for alignment errors and improve accuracy and stability of bonding.

Optionally, a first insulating layer r1 is disposed between a portion of the first independent electrode 2*a*1 extending into the first through-hole g1 and a sidewall of the first through-hole g1 to avoid short-circuiting of the first independent electrode 2*a*1 and the first LED structure 2*a*.

A second insulating layer r2 is disposed between the first electrical switching member 2*d*1 and a sidewall of the first hollow hole k1 to avoid short-circuiting of the first electrical switching member 2*d*1 and the first LED structure 2*a*. A third insulating layer r3 is disposed between a portion of the second independent electrode 2*b*1 extending into the second through-hole g2 and a sidewall of the second through-hole g2 to avoid short-circuiting of the second independent electrode 2*b*1 and the second LED structure 2*b*.

A fourth insulating layer r4 is disposed on sidewalls of the first connecting part d1 and the second hollow hole k2 to avoid short-circuiting of the first connecting part d1 and the first LED structure 2*a*. A fifth insulating layer r5 is disposed between the second connecting part d2 and a sidewall of the third hollow hole k3 to avoid short-circuiting of the second connecting part d2 and the second LED structure 2*b*. A sixth insulating layer r6 is disposed between a portion of the third independent electrode 2*c*1 extending into the third through-hole g3 and a sidewall of the third through-hole g3 to avoid short-circuiting the third independent electrode 2*c*1 and the third LED structure 2*c*.

A seventh insulating layer r7 is disposed between the first conductive bonding part s1 and a sidewall of the first opening v1 to avoid short-circuiting of the first conductive bonding part s1 and the first LED structure 2*a*. An eighth insulating layer r8 is disposed between the third conductive bonding part s3 and a sidewall of the third opening v3 to avoid short-circuiting of the third conductive bonding part s3 and the second LED structure 2*b*.

It will be appreciated that in some embodiments, members in one of the following groups are connected through bonding: the drive substrate 10 and the first LED structure 2*a*, the first LED structure 2*a* and the second LED structure 2*b*, and the second LED structure 2*b* and the third LED structure 2*c*; and the other groups may adopt a direct formation manner. For example, the first LED structure 2*a* is formed directly on the drive substrate 10, the third LED structure 2*c* is formed directly on the second LED structure 2*b*, and the second LED structure 2*b* is bonded onto the first LED structure.

In some embodiments, the connections in two of the following groups are through bonding: the drive substrate 10 and the first LED structure 2*a*, the first LED structure 2*a* and the second LED structure 2*b*, and the second LED structure 2*b* and the third LED structure 2*c*; and the other group may adopt a direct formation manner. For example, the first LED structure 2*a* is bonded onto the drive substrate 10, the third LED structure 2*c* is directly formed on the second LED structure 2*b*, and the second LED structure 2*b* is bonded onto the first LED structure 2*a*.

Optionally, the display panel 100 further includes a first Bragg reflective layer 2*e*1 and a second Bragg reflective layer 2*e*2. The first Bragg reflective layer 2*e*1 is disposed between the fourth bonding layer f4 and the second common electrode 2*b*2. The second opening v2 extends through the first Bragg reflective layer 2*e*1. The first Bragg reflective layer 2*e*1 is configured to reflect light emitted by the second LED structure 2*b* and transmit light emitted by the first LED structure 2*a*.

The second Bragg reflective layer 2*e*2 is disposed between the sixth bonding layer f6 and the third common electrode 2*c*2. The fourth opening v4 extends through the second Bragg reflective layer 2*e*2. The second Bragg reflective layer 2*e*2 is configured to reflect light emitted by the third LED structure 2*c* and transmit light emitted by the first LED structure 2*a* and the second LED structure 2*b*.

As such, light generated from the first LED structure 2*a* may be emitted to the outside through the second LED structure 2*b* and the third LED structure 2*c*, and light generated from the second LED structure 2*b* may be emitted to the outside through the third LED structure 2*c*. In addition, it is possible to prevent the light generated from the second LED structure 2*b* from being lost due to incidence into the first LED structure 2*a*, or to prevent the light generated from the third LED structure 2*c* from being lost due to incidence into the second LED structure 2*a*.

The Bragg reflective layer may be formed by alternately stacking a high refractive index film layer(s) and a low refractive index film layer(s), and light of a specific wavelength may be reflected by adjusting the refractive index(es) and the thickness(es) of the film layer(s).

Based on the above structure, given a same area, four groups of overlapping apertures (through-holes, hollow holes and openings) are provided in the first LED structure 2*a*, three groups of overlapping apertures are provided in the second LED structure 2*b*, and two groups of overlapping apertures are provided in the third LED structure 2*c*. Therefore, the light-emitting area of the first LED structure 2*a* is smaller than that of the second LED structure 2*b*, and the light-emitting area of the second LED structure 2*b* is smaller than that of the third LED structure 2*c*.

Since the first LED structure 2*a* emits red light, the second LED structure 2*b* emits green light, and the third LED structure 2*c* emits blue light, the luminance per unit area of the blue light is the lowest, and the luminance per unit area of the red light is the highest, therefore, the first LED structure 2*a* is provided with the most groups of apertures, and the third LED structure 2*c* is provided with the least groups of apertures to adjust the light-emitting areas of the three, thereby improving the uniformity of the luminance emittance of the display panel 100.

In the orthographic projection of the pixel 20 in the present embodiment, the four groups of overlapping apertures of the pixel 20 are respectively disposed in the four corner areas of the pixel 20 in a one-to-one correspondence.

The anodes of the first LED structure 2*a*, the second LED structure 2*b*, and the third LED structure 2*c* are commonly electrically connected to the fourth conductive pad 10*d*, and the cathodes of the first LED structure 2*a*, the second LED structure 2*b*, and the third LED structure 2*c* are electrically connected to the first conductive pad 10*a*, the second conductive pad 10*b*, and the third conductive pad 10*c*, respectively, which conductive pads are different from each other. Therefore, the first to third LED structures 2*a*, 2*b*, and 2*c* may be independently driven.

The LED structures 2*a*, 2*b*, and 2*c* may be disposed on the drive substrate 10, and may be electrically connected to an internal circuitry of the drive substrate 10 so as to be driven in an active matrix manner.

Figure 12:
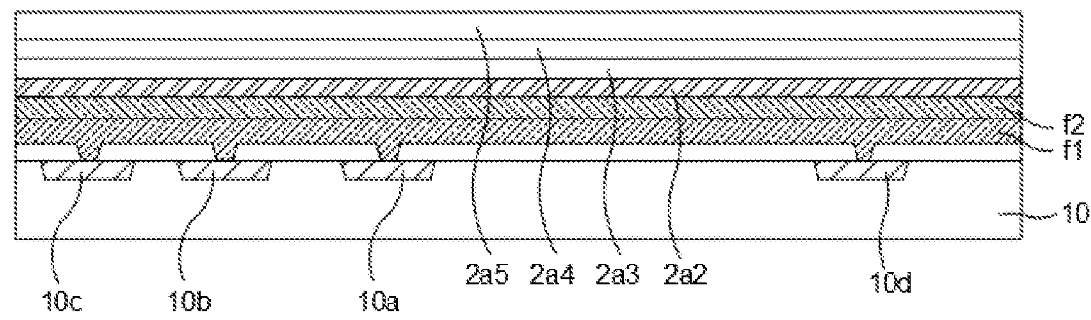
FIG. 12 is a schematic diagram of a structure provided by step S1 of another method for preparing a display panel according to an embodiment of the present disclosure.

It should be noted that the manufacturing process of the display panel 100 of the present embodiment includes the following steps:

Referring to FIG. 12, at step S1, a first bonding layer f1 is formed on the drive substrate 10. A second bonding layer f2 is formed on a surface of the first LED having a first backplane adjacent to the drive substrate 10. The first LED is bonded to the drive substrate 10 such that the first bonding layer f1 is bonded to the second bonding layer f2. The first backplane is then removed to expose the second conductive type semiconductor layer 2*a*5 of the first LED.

Figure 13:
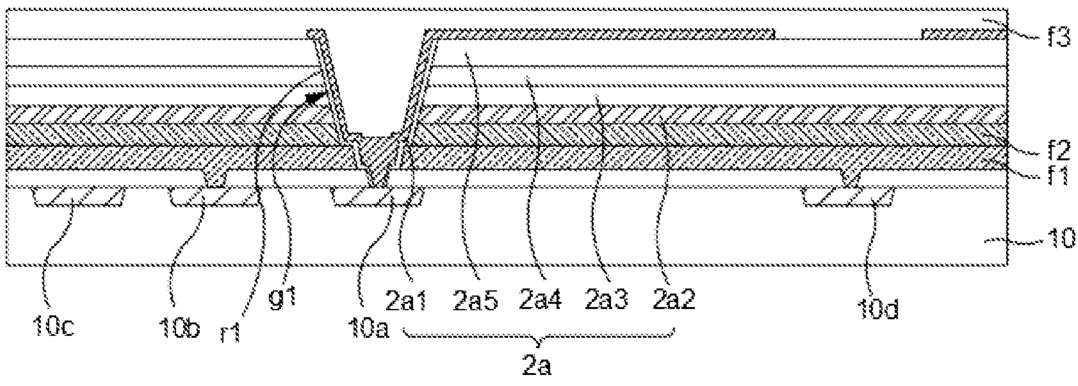
FIG. 13 is a schematic diagram of a structure provided by step S2 of another method for preparing a display panel according to an embodiment of the present disclosure.

Referring to FIG. 13, at step S2, the first LED is patterned to form the first through-hole g1 exposing the first conductive pad 10*a*. Then, the first insulating layer r1 exposing the first conductive pad 10*a* is formed on a hole wall of the first through-hole g1. Next, a patterned first independent electrode 2*a*1 is formed on the first LED, and the first independent electrode 2*a*1 is connected to the first conductive pad 10*a* through the first through-hole g1 to form the first LED structure 2*a*. Subsequently, a third bonding layer f3 filling the first through-hole g1 and covering the first independent electrode 2*a*1 is formed on the first independent electrode 2*a*1. Subsequently, the third bonding layer f3 is thinned using a CMP process.

Optionally, the size of the first through-hole g1 is less than or equal to 1 micron, for example, 1 micron, 0.9 microns, 0.8 microns, 0.7 microns, 0.6 microns, 0.5 microns, 0.4 microns, 0.3 microns or 0.2 microns.

The thickness of each of the first independent electrode 2*a*1 and the first common electrode 2*a*2 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the first independent electrode 2*a*1 and the second common electrode 2*a*2.

The thickness of the thinned third bonding layer f3 (not the thickness at the first through-hole g1) is greater than or equal to 3000 Angstroms, for example, 3000 Angstroms, 3100 Angstroms, 3200 Angstroms, 3300 Angstroms, 3400 Angstroms, 3500 Angstroms, 3600 Angstroms, 3700 Angstroms, 3800 Angstroms, 3900 Angstroms, 4000 Angstroms, 4500 Angstroms, or 5000 Angstroms, etc. The thinned third bonding layer f3 has a thickness greater than or equal to 3000 Angstroms to ensure that the third bonding layer f3 has a minimum bonding thickness after the subsequent grinding step.

Figure 14:
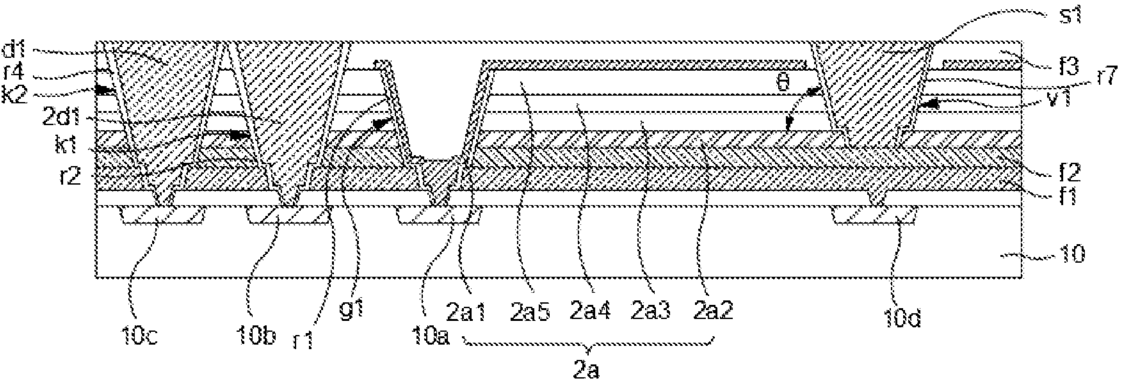
FIG. 14 is a schematic diagram of a structure provided by step S3 of another method for preparing a display panel according to an embodiment of the present disclosure.

Referring to FIG. 14, at step S3, a third bonding layer f3 is patterned to form a first opening v1, a first hollow hole k1, and a second hollow hole k2, where the first opening v1 exposes the second bonding layer f2, the first hollow hole k1 exposes the second conductive pad 10*b*, and the second hollow hole k2 exposes the third conductive pad 10*c*. A seventh insulating layer r7 is formed on a sidewall of the first opening v1, a second insulating layer r2 is formed on a sidewall of the first hollow hole k1, and a fourth insulating layer r4 is formed on a sidewall of the second hollow hole k2. Subsequently, a first metal layer is formed on the third bonding layer f3, and the first metal layer fills at least the first opening v1, the first hollow hole k1, and the second hollow hole k2 and covers the third bonding layer f3. Subsequently, the first metal layer is ground off, and the first metal layer except for its portions in the first opening v1, the first hollow hole k1, and the second hollow hole k2 is removed to form the first conductive bonding part s1, the first electrical switching member 2*d*1, and the first connecting part d1 that are flush with the third bonding layer f3.

Optionally, the grinding is carried out using a chemical-mechanical polishing (CMP) process. The first metal layer is ground in an over-grinding manner. That is, in addition to grinding off the first metal layer on the upper surface of the third bonding layer f3, a small portion of the third bonding layer f3 is ground off, thereby improving the stability of subsequent bonding.

The first opening v1, the first hollow hole k1, and the second hollow hole k2 each have a size of less than or equal to 1 micron, for example, 1 micron, 0.9 microns, 0.8 microns, 0.7 microns, 0.6 microns, 0.5 microns, 0.4 microns, 0.3 microns, or 0.2 microns.

Each of the first opening v1, the first hollow hole k1, and the second hollow hole k2 has a slope angle greater than or equal to 85 degrees and less than or equal to 90 degrees.

The thickness of the third bonding layer f3 after grinding is greater than or equal to 1000 Angstroms, for example, 1000 Angstroms, 1500 Angstroms, or 2000 Angstroms, for assisting the bonding process.

Figure 15:
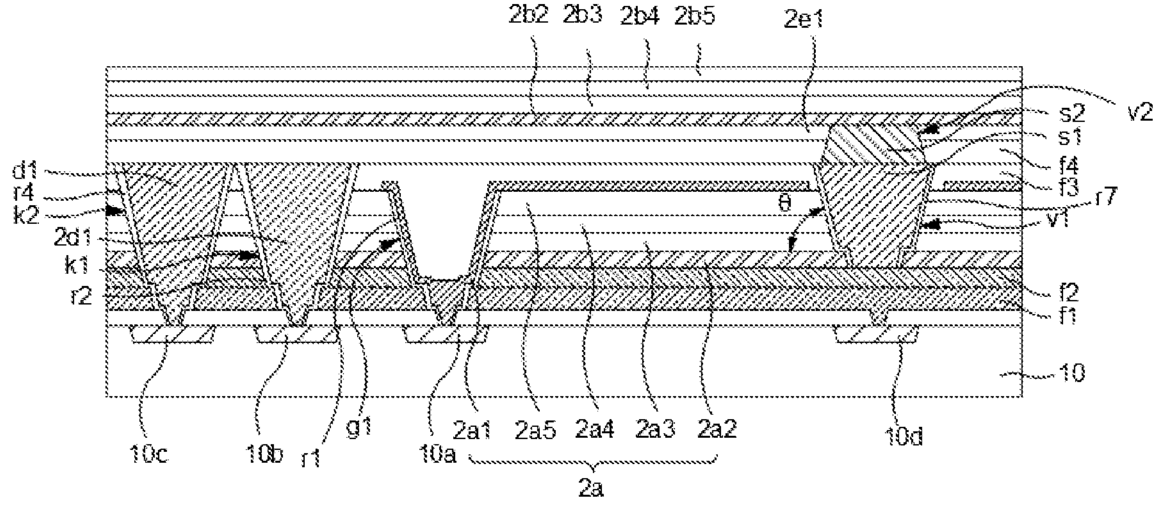
FIG. 15 is a schematic diagram of a structure provided by step S4 of another method for preparing a display panel according to an embodiment of the present disclosure.

Referring to FIG. 15, at step S4, a first Bragg reflective layer 2*e*1 and a fourth bonding layer f4 are sequentially formed on a surface of a second LED having a second backplane adjacent to the drive substrate 10, the fourth bonding layer f4 is patterned to form a second opening v2, and the second opening v2 exposes the second common electrode 2*b*2. Subsequently, a second metal layer is formed on the fourth bonding layer f4, and the second metal layer covers the fourth bonding layer f4 and fills the second opening v2. Next, the second metal layer is ground, and the second metal layer except for its portion in the second opening v2 is removed to form a second conductive bonding part s2 that is flush with the fourth bonding layer f4.

Step S4 further includes bonding the second LED and the first LED structure 2*a* such that the third bonding layer f3 is bonded to the fourth bonding layer f4, and the first conductive bonding part s1 is bonded to the second conductive bonding part s2; and then removing the second backplane to expose the fourth conductive type semiconductor layer 2*b*5 of the second LED.

Optionally, the thickness of the fourth bonding layer f4 after grinding is greater than or equal to 1000 Angstroms, for example, 1000 Angstroms, 1500 Angstroms, or 2000 Angstroms, for assisting bonding process.

The thickness of the second metal layer is greater than the depth of the second opening v2.

The size of the second opening v2 is less than or equal to 1 micron, for example, 1 micron, 0.9 microns, 0.8 microns, 0.7 microns, 0.6 microns, 0.5 microns, 0.4 microns, 0.3 microns, or 0.2 microns. The slope angle of the second opening v2 is greater than or equal to 85 degrees and less than or equal to 90 degrees.

Figure 16:
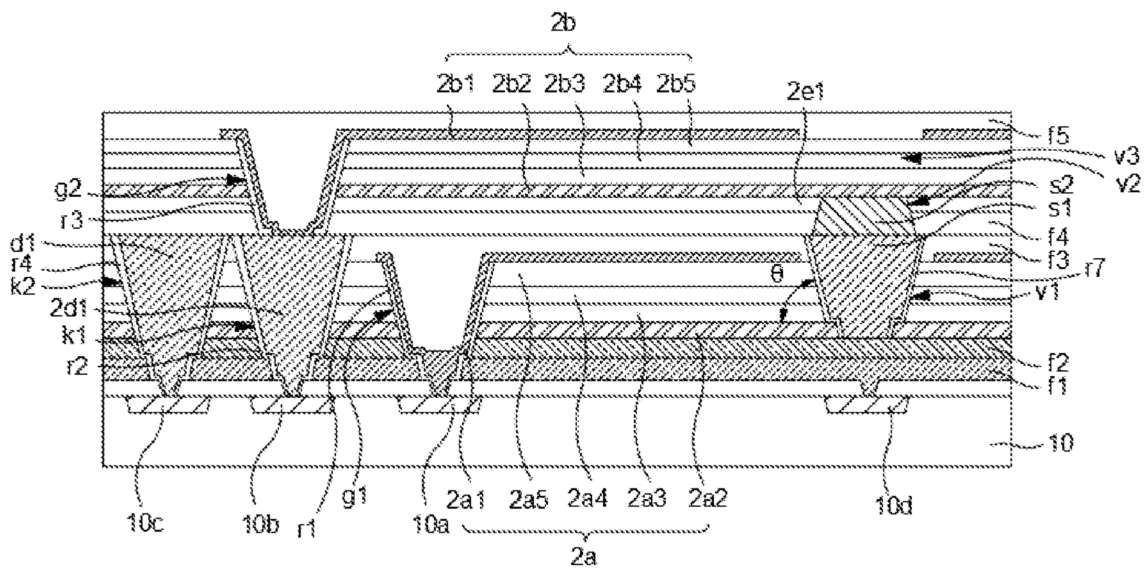
FIG. 16 is a schematic diagram of a structure provided by step S5 of another method for preparing a display panel according to an embodiment of the present disclosure.

Referring to FIG. 16, at step S5, the second LED is patterned to form a second through-hole g2 exposing the first electrical switching member 2*d*1. Then, a third insulating layer r3 exposing the first electrical switching member 2*d*1 is formed on a hole wall of the second through-hole g2. Next, a patterned second independent electrode 2*b*1 is formed on the second LED, and the second independent electrode 2*b*1 is connected to the first electrical switching member 2*d*1 through the second through-hole g2 to form the second LED structure 2*b*. Subsequently, a fifth bonding layer f5 filling the second through-hole g2 and covering the second independent electrode 2*b*1 is formed on the second independent electrode 2*b*1. Subsequently, the fifth bonding layer f5 is thinned by a CMP process.

Optionally, the size of the second through-hole g2 is less than or equal to 1 micron, for example, 1 micron, 0.9 microns, 0.8 microns, 0.7 microns, 0.6 microns, 0.5 microns, 0.4 microns, 0.3 microns, or 0.2 microns.

The thickness of each of the second common electrode 2*b*2 and the second independent electrode 2*b*1 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the second common electrode 2*b*2 and the second independent electrode 2*b*1.

The thickness of the thinned fifth bonding layer f5 (not the thickness at the second through-hole g2) is greater than or equal to 3000 Angstroms, for example, 3000 Angstroms, 3100 Angstroms, 3200 Angstroms, 3300 Angstroms, 3400 Angstroms, 3500 Angstroms, 3600 Angstroms, 3700 Angstroms, 3800 Angstroms, 3900 Angstroms, 4000 Angstroms, 4500 Angstroms, or 5000 Angstroms, etc. The thinned fifth bonding layer f5 has a thickness greater than or equal to 3000 Angstroms to ensure that the fifth bonding layer f5 has a minimum bonding thickness after the subsequent grinding step.

Figure 17:
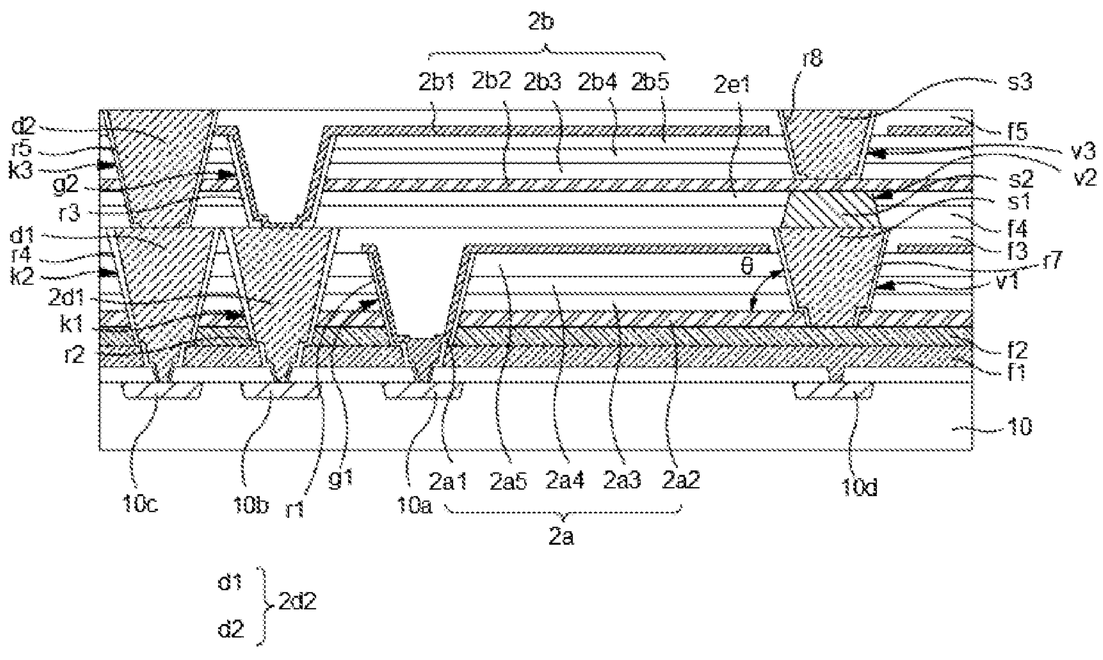
FIG. 17 is a schematic diagram of a structure provided by step S6 of another method for preparing a display panel according to an embodiment of the present disclosure.

Referring to FIG. 17, at step S6, the fifth bonding layer f5 is patterned to form a third opening v3 exposing the second common electrode 2*b*2 and a third hollow hole k3 exposing the first connecting part d1. An eighth insulating layer r8 is formed on a sidewall of the third opening v3. Subsequently, a third metal layer filling at least the third opening v3 and the third hollow hole k3 and covering the fifth bonding layer f5 is formed on the fifth bonding layer f5. Subsequently, the third metal layer is ground off, and the third metal layer except for its portions in the third opening v3 and the third hollow hole k3 is removed to form the third conductive bonding part s3 and the second electrical connecting part d2 that are flush with the fifth bonding layer f5.

Optionally, the grinding is carried out using a chemical-mechanical polishing (CMP) process. The third metal layer is ground in an over-grinding manner. That is, in addition to grinding off the third metal layer on the upper surface of the fifth bonding layer f5, a small portion of the fifth bonding layer f5 is ground off, thereby improving the stability of subsequent bonding.

The third opening v3 and the third hollow hole k3 each have a size of less than or equal to 1 micron, for example, 1 micron, 0.9 microns, 0.8 microns, 0.7 microns, 0.6 microns, 0.5 microns, 0.4 microns, 0.3 microns, or 0.2 microns.

The third opening v3 and the third hollow hole k3 each have a slope angle greater than or equal to 85 degrees and less than or equal to 90 degrees.

The thickness of the fifth bonding layer f5 after grinding is greater than or equal to 1000 Angstroms, for example, 1000 Angstroms, 1500 Angstroms, or 2000 Angstroms, for assisting the bonding process.

Figure 18:
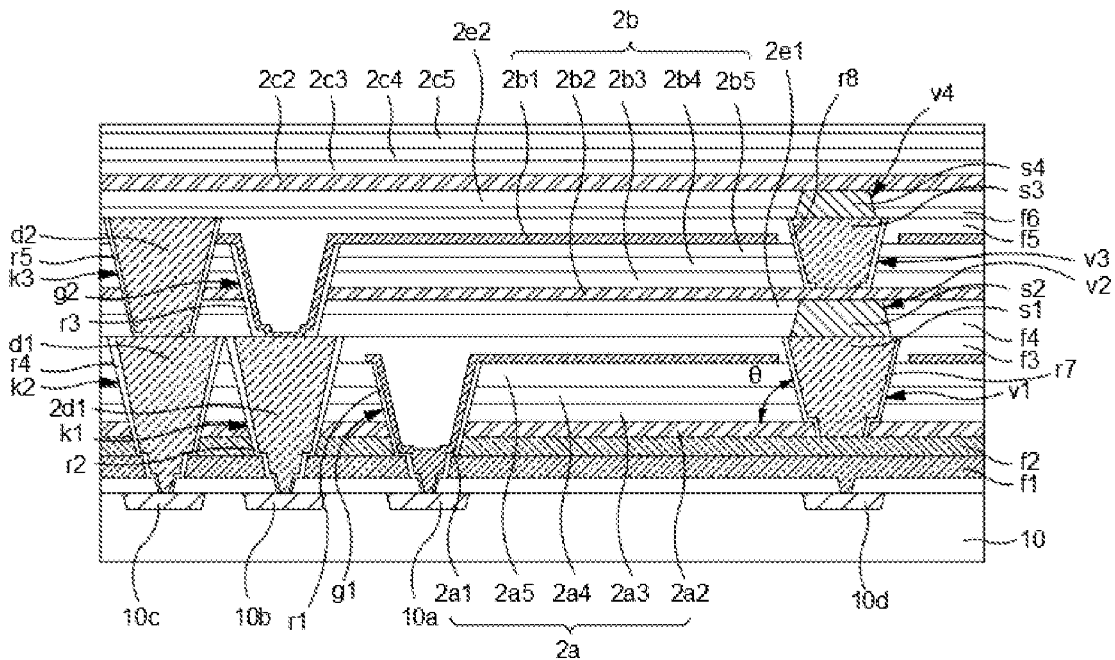
FIG. 18 is a schematic diagram of a structure provided by step S7 of another method for preparing a display panel according to an embodiment of the present disclosure.

Referring to FIG. 18, at step S7, a second Bragg reflective layer 2*e*2 and a sixth bonding layer f6 are sequentially formed on a surface of a third LED having a third backplane adjacent to the drive substrate 10. A fourth opening v4 is formed by patterning the sixth bonding layer f6, and the fourth opening v4 exposes the third common electrode 2*c*2. Subsequently, a fourth metal layer is formed on the sixth bonding layer f6, and the fourth metal layer covers the sixth bonding layer f6 and fills the fourth opening v4. Next, the fourth metal layer is ground off, and the fourth metal layer except for its portion in the fourth opening v4 is removed to form a fourth conductive bonding part s4 that is flush with the sixth bonding layer f6.

Step S7 further includes bonding the third LED and the second LED structure 2*b* such that the fifth bonding layer f5 is bonded to the sixth bonding layer f6; and then removing the third backplane, such that the sixth conductive type semiconductor layer 2*c*5 of the third LED is exposed.

Optionally, the thickness of the sixth bonding layer f6 after grinding is greater than or equal to 1000 Angstroms, for example, 1000 Angstroms, 1500 Angstroms, or 2000 Angstroms, for assisting the bonding process.

The thickness of the fourth metal layer is greater than the depth of the fourth opening v4.

The size of the fourth opening v4 is less than or equal to 1 micron, for example, 1 micron, 0.9 microns, 0.8 microns, 0.7 microns, 0.6 microns, 0.5 microns, 0.4 microns, 0.3 microns, or 0.2 microns. The slope angle of the fourth opening v4 is greater than or equal to 85 degrees and less than or equal to 90 degrees.

Figure 19:
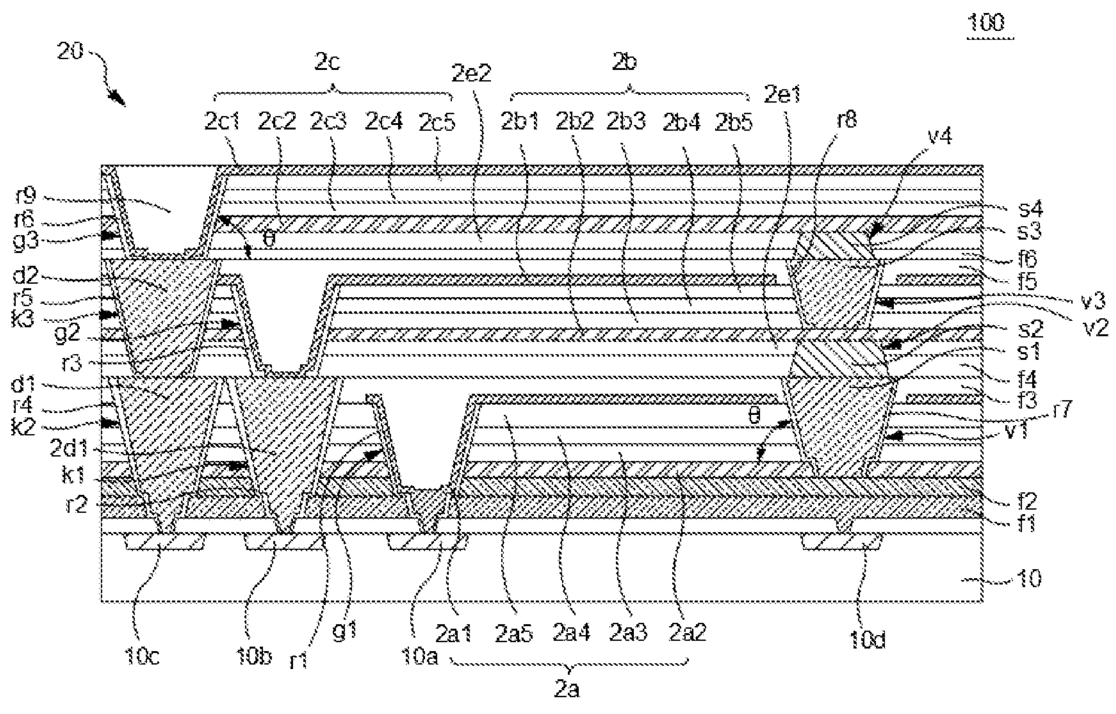
FIG. 19 is a schematic diagram of a structure provided by step S8 of another method for preparing a display panel according to an embodiment of the present disclosure.

Referring to FIG. 19, at step S8, the third LED is patterned to form a third through-hole g3 exposing the second connecting part d2. Then, a sixth insulating layer r6 exposing the second connecting part d2 is formed on a hole wall of the third through-hole g3. Next, a patterned third independent electrode 2*c*1 is formed on the third LED, and the third independent electrode 2*c*1 is connected to the second connecting part d2 through the third through-hole g3 to form the third LED structure 2*c*.

Optionally, step S8 further includes filling the third through-hole g3 with a protective layer r9 so that the protective layer r9 is flush with the third independent electrode 2*c*1. The material of the protective layer r9 is an insulating material.

The first LED structure 2*a*, the second LED structure 2*b*, and the third LED structure 2*c* are stacked to form a pixel 20.

Optionally, the size of the third through-hole g3 is less than or equal to 1 micron, for example, 1 micron, 0.9 microns, 0.8 microns, 0.7 microns, 0.6 microns, 0.5 microns, 0.4 microns, 0.3 microns, or 0.2 microns.

The thickness of each of the third common electrode 2*c*2 and the third independent electrode 2*c*1 is greater than or equal to 1000 Angstroms, and may be, for example, 1000 Angstroms, 1100 Angstroms, 1200 Angstroms, 1300 Angstroms, 1400 Angstroms, 1500 Angstroms, 1600 Angstroms, 1700 Angstroms, 1800 Angstroms, 1900 Angstroms, or 2000 Angstroms, etc. Such an arrangement ensures the conductivity of the third common electrode 2*c*2 and the third independent electrode 2*c*1.

The foregoing has described in detail a display panel according to embodiments of the present disclosure, in which specific examples are used to illustrate the principles and embodiments of the present disclosure. The description of the above embodiments is merely provided to assist in understanding the methods of the present disclosure and the core concepts thereof. Meanwhile, variations will occur to those skilled in the art in both the detailed description and the scope of application in accordance with the ideas of the present disclosure. In view of the foregoing, the present description should not be construed as limiting the present disclosure.

What is claimed is:

1. A display panel comprising:

a drive substrate comprising a plurality of conductive pads disposed at intervals;

a plurality of pixels disposed on the drive substrate, each pixel comprising:

a first LED structure disposed on the drive substrate, the first LED structure comprising a first independent electrode located on a side away from the drive substrate, the first independent electrode being electrically connected to one of the conductive pads;

a second LED structure disposed on a side of the first LED structure away from the drive substrate, the second LED structure comprising a second independent electrode located on a side away from the first LED structure, the second independent electrode being electrically connected to another one of the conductive pads;

a third LED structure disposed on a side of the second LED structure away from the drive substrate, the third LED structure comprising a third independent electrode located on a side away from the second LED structure, the third independent electrode being electrically connected to yet another one of the conductive pads; and at least one electrical switching member disposed on a side of the third LED structure adjacent to the drive substrate, one of the at least one electrical switching members being correspondingly connected to and disposed on one of the conductive pads;

wherein at least one of the first independent electrode, the second independent electrode, and the third independent electrode is connected to one of the at least one electrical switching members through at least one through-hole; in a direction perpendicular to a panel surface of the display panel, the through-hole is disposed to overlap with the electrical switching member.

2. The display panel of claim 1, wherein the display panel further comprises a first bonding layer and a second bonding layer, materials of the first bonding layer and the second bonding layer both being insulating materials, the first bonding layer being connected to and disposed on a surface of the drive substrate adjacent to the first LED structure, the second bonding layer being connected to and disposed on a surface of the first LED structure adjacent to the drive substrate, and the first bonding layer being bonded to the second bonding layer;

the first LED structure comprises a first common electrode, a first conductive type semiconductor layer, a first light-emitting material layer, a second conductive type semiconductor layer, and the first independent electrode, which are sequentially stacked on a surface of the second bonding layer away from the drive substrate;

the at least one electrical switching member comprises a first electrical switching member, and the plurality of conductive pads comprises a first conductive pad, the first bonding layer being provided with a first hollow hole exposing the first conductive pad, and the first electrical switching member being filled in the first hollow hole and connected to the first conductive pad; and the at least one through-hole comprises a first through-hole provided in the first LED structure, the first through-hole extending through the second conductive type semiconductor layer, the first light-emitting material layer, the first conductive type semiconductor layer, the first common electrode, and the second bonding layer, the first independent electrode extending over the first through-hole and being connected to the first electrical switching member.

3. The display panel of claim 2, wherein the display panel further comprises a third bonding layer and a fourth bonding layer, materials of the third bonding layer and the fourth bonding layer both being insulating materials, the third bonding layer being connected to and disposed on a surface of the first LED structure adjacent to the second LED structure, the fourth bonding layer being connected to and disposed on a surface of the second LED structure adjacent to the drive substrate, and the third bonding layer being bonded to the fourth bonding layer;

the second LED structure comprises a second common electrode, a third conductive type semiconductor layer, a second light-emitting material layer, a fourth conductive type semiconductor layer, and the second independent electrode, which are sequentially stacked on a surface of the fourth bonding layer away from the drive substrate;

the plurality of conductive pads comprise a second conductive pad, and the at least one electrical switching member comprises a second electrical switching member, the second electrical switching member comprising a first connecting part and a second connecting part, the first bonding layer being provided with a second hollow hole exposing the second conductive pad, the first connecting part being filled in the second hollow hole and connected to the second conductive pad, the first LED structure being provided with a third hollow hole, the third hollow hole extending through the third bonding layer, the second conductive type semiconductor layer, the first light-emitting material layer, the first conductive type semiconductor layer, the first common electrode and the second bonding layer and exposing the first connecting part, and the second connecting part being filled in the third hollow hole and connected to the first connecting part; and the at least one through-hole comprises a second through-hole provided in the second LED structure, the second through-hole extending through the fourth conductive type semiconductor layer, the second light-emitting material layer, the third conductive type semiconductor layer, the second common electrode, and the fourth bonding layer, the second independent electrode extending over the second through-hole and being connected to the second connecting part.

4. The display panel of claim 3, wherein the display panel further comprises a fifth bonding layer and a sixth bonding layer, materials of the fifth bonding layer and the sixth bonding layer both being insulating materials, the fifth bonding layer being connected to and disposed on a surface of the second LED structure adjacent to the third LED structure, the sixth bonding layer being connected to and disposed on a surface of the third LED structure adjacent to the drive substrate, and the fifth bonding layer being bonded to the sixth bonding layer;

the third LED structure comprises a third common electrode, a fifth conductive type semiconductor layer, a third light-emitting material layer, a sixth conductive type semiconductor layer, and the third independent electrode, which are sequentially stacked on a surface of the sixth bonding layer away from the drive substrate;

the plurality of conductive pads comprise a third conductive pad, and the at least one electrical switching member comprises a third electrical switching member, the third electrical switching member comprising a third connecting part, a fourth connecting part, and a fifth connecting part, the first bonding layer being provided with a fourth hollow hole exposing the third conductive pad, the third connecting part being filled in the fourth hollow hole and connected to the third conductive pad; the first LED structure is provided with a fifth hollow hole, the fifth hollow hole extending through the third bonding layer, the second conductive type semiconductor layer, the first light-emitting material layer, the first conductive type semiconductor layer, the first common electrode, and the second bonding layer and exposing the third connecting part, the fourth connecting part being filled in the fifth hollow hole and connected to the third connecting part; the second LED structure being provided with a sixth hollow hole, the sixth hollow hole extending through the fifth bonding layer, the fourth conductive type semiconductor layer, the second light-emitting material layer, the third conductive type semiconductor layer, the second common electrode, and the fourth bonding layer and exposing the fourth connecting part, and the fifth connecting part being filled in the sixth hollow hole and connected to the fourth connecting part; and the at least one through-hole comprises a third through-hole provided in the third LED structure, the third through-hole extending through the sixth conductive type semiconductor layer, the third light-emitting material layer, the fifth conductive type semiconductor layer, the third common electrode, and the sixth bonding layer, and the third independent electrode extending over the third through-hole and being connected to the fifth connecting part.

5. The display panel of claim 4, wherein in the direction perpendicular to the panel surface of the display panel, the first through-hole is aligned with the first hollow hole; the second through-hole, the second hollow hole, and the third hollow hole being aligned; and the third through-hole, the fourth hollow hole, the fifth hollow hole, and the sixth hollow hole being aligned.

6. The display panel of claim 5, wherein slope angles of the first through-hole to the third through-hole and the first hollow hole to the sixth hollow hole are each between 85 degrees and 90 degrees.

7. The display panel of claim 5, wherein the plurality of conductive pads further comprises a fourth conductive pad, the first common electrode, the second common electrode, and the third common electrode each being electrically connected to the fourth conductive pad;

the first bonding layer is provided with a first opening, the first opening being filled with a first conductive bonding part, the first conductive bonding part being connected to the fourth conductive pad; the second bonding layer is provided with a second opening, the second opening being filled with a second conductive bonding part, and the second conductive bonding part being connected to the first common electrode and being bonded to the first conductive bonding part;

the third bonding layer is provided with a third opening, the third opening further extending through the first independent electrode, the second conductive type semiconductor layer, the first light-emitting material layer, and the first conductive type semiconductor layer, the third opening being filled with a third conductive bonding part, the third conductive bonding part being connected to the first common electrode, the fourth bonding layer being provided with a fourth opening, the fourth opening being filled with a fourth conductive bonding part, and the fourth conductive bonding part being connected to the second common electrode and bonded to the third conductive bonding part; and the fifth bonding layer is provided with a fifth opening, the fifth opening further extending through the second independent electrode, the fourth conductive type semiconductor layer, the second light-emitting material layer, and the third conductive type semiconductor layer, the fifth opening being filled with a fifth conductive bonding part, the fifth conductive bonding part being connected to the second common electrode, the sixth bonding layer being provided with a sixth opening, the sixth opening being filled with a sixth conductive bonding part, and the sixth conductive bonding part being connected to the third common electrode and bonded to the fifth conductive bonding part.

8. The display panel of claim 7, wherein the first opening to the sixth opening are disposed to be aligned in the direction perpendicular to the panel surface of the display panel.

9. The display panel of claim 7, wherein a first insulating layer is disposed between a portion of the first independent electrode extending into the first through-hole and a sidewall of the first through-hole;

a second insulating layer is disposed between the second connecting part and a sidewall of the third hollow hole, and a third insulating layer is disposed between a portion of the second independent electrode extending into the second through-hole and a sidewall of the second through-hole;

a fourth insulating layer is further disposed on sidewalls of the fourth connecting part and the fifth hollow hole, a fifth insulating layer is disposed between the fifth connecting part and a sidewall of the sixth hollow hole, and a sixth insulating layer is disposed between a portion of the third independent electrode extending into the third through-hole and a sidewall of the third through-hole; and a seventh insulating layer is disposed between the third conductive bonding part and a sidewall of the third opening, and an eighth insulating layer is disposed between the fifth conductive bonding part and a sidewall of the fifth opening.

10. The display panel of claim 7, wherein the first conductive type semiconductor layer, the third conductive semiconductor layer, and the fifth conductive semiconductor layer are P-type semiconductor layers, and the second conductive type semiconductor layer, the fourth conductive semiconductor layer, and the sixth conductive semiconductor layer are N-type semiconductor layers.

11. The display panel of claim 10, wherein the first LED structure is configured to emit red light, the second LED structure is configured to emit green light, and the third LED structure is configured to emit blue light.

12. The display panel of claim 10, wherein the display panel further comprises a first Bragg reflective layer and a second Bragg reflective layer, the first Bragg reflective layer being disposed between the fourth bonding layer and the second common electrode and configured to reflect light emitted by the second LED structure and transmit light emitted by the first LED structure; and the second Bragg reflective layer is disposed between the sixth bonding layer and the third common electrode, the second Bragg reflective layer being configured to reflect light emitted by the third LED structure and transmit light emitted by the first LED structure and the second LED structure.

13. The display panel of claim 1, wherein the display panel further comprises a first bonding layer and a second bonding layer, materials of the first bonding layer and the second bonding layer both being metal materials, the first bonding layer being connected to and disposed on a surface of the drive substrate adjacent to the first LED structure, the second bonding layer being connected to and disposed on a surface of the first LED structure adjacent to the drive substrate, and the first bonding layer being bonded to the second bonding layer;

the first LED structure comprises a first common electrode, a first conductive type semiconductor layer, a first light-emitting material layer, a second conductive type semiconductor layer, and the first independent electrode, which are sequentially stacked on a surface of the second bonding layer away from the drive substrate; and the plurality of conductive pads comprise a first conductive pad, and the least one through-hole comprises a first through-hole provided in the first LED structure, the first through-hole extending through the second conductive type semiconductor layer, the first light-emitting material layer, the first conductive type semiconductor layer, the first common electrode, the second bonding layer, and the first bonding layer and exposing the first conductive pad, the first independent electrode extending over the first through-hole and being connected to the first conductive pad.

14. The display panel of claim 13, wherein the display panel further comprises a third bonding layer and a fourth bonding layer, materials of the third bonding layer and the fourth bonding layer both being insulating materials, the third bonding layer being connected to and disposed on a surface of the first LED structure adjacent to the second LED structure, the fourth bonding layer being connected to and disposed on a surface of the second LED structure adjacent to the drive substrate, and the third bonding layer being bonded to the fourth bonding layer;

the second LED structure comprises a second common electrode, a third conductive type semiconductor layer, a second light-emitting material layer, a fourth conductive type semiconductor layer, and the second independent electrode, which are sequentially stacked on a surface of the fourth bonding layer away from the drive substrate;

the plurality of conductive pads comprise a second conductive pad, the at least one electrical switching member comprises a first electrical switching member, and the first LED structure is provided with a first hollow hole, the first hollow hole extending through the third bonding layer, the second conductive type semiconductor layer, the first light-emitting material layer, the first conductive type semiconductor layer, the first common electrode, the second bonding layer and the first bonding layer and exposing the second conductive pad, and the first electrical switching member being filled in the first hollow hole and connected to the second conductive pad; and the at least one through-hole comprises a second through-hole provided in the second LED structure, the second through-hole extending through the fourth conductive type semiconductor layer, the second light-emitting material layer, the third conductive type semiconductor layer, the second common electrode, and the fourth bonding layer, the second independent electrode extending over the second through-hole and being connected to the first electrical switching member.

15. The display panel of claim 14, wherein the display panel further comprises a fifth bonding layer and a sixth bonding layer, materials of the fifth bonding layer and the sixth bonding layer both being insulating materials, the fifth bonding layer being connected to and disposed on a surface of the second LED structure adjacent to the third LED structure, the sixth bonding layer being connected to and disposed on a surface of the third LED structure adjacent to the drive substrate, and the fifth bonding layer being bonded to the sixth bonding layer;

the third LED structure comprises a third common electrode, a fifth conductive type semiconductor layer, a third light-emitting material layer, a sixth conductive type semiconductor layer, and the third independent electrode, which are sequentially stacked on a surface of the sixth bonding layer away from the drive substrate;

the plurality of conductive pads comprise a third conductive pad, and the at least one electrical switching member comprises a second electrical switching member, the second electrical switching member comprising a first connecting part and a second connecting part, the first LED structure being provided with a second hollow hole, the second hollow hole extending through the third bonding layer, the second conductive type semiconductor layer, the first light-emitting material layer, the first conductive type semiconductor layer, the first common electrode, the second bonding layer and the first bonding layer and exposing the third conductive pad, the first connecting part being filled in the second hollow hole and connected to the third conductive pad; the second LED structure is provided with a third hollow hole, the third hollow hole extending through the fifth bonding layer, the fourth conductive type semiconductor layer, the second light-emitting material layer, the third conductive type semiconductor layer, the second common electrode, and the fourth bonding layer and exposing the first connecting part, and the second connecting part being filled in the third hollow hole and connected to the first connecting part; and the at least one through-hole comprises a third through-hole provided in the third LED structure, the third through-hole extending through the sixth conductive type semiconductor layer, the third light-emitting material layer, the fifth conductive type semiconductor layer, the third common electrode, and the sixth bonding layer, and the third independent electrode extending over the third through-hole and being connected to the second connecting part.

16. The display panel of claim 15, wherein in the direction perpendicular to the panel surface of the display panel, the second through-hole is aligned with the first hollow hole; and the third through-hole, the second hollow hole and the third hollow hole being aligned.

17. The display panel of claim 16, wherein slope angles of the first through-hole to the third through-hole and the first hollow hole to the third hollow hole are each between 85 degrees and 90 degrees.

18. The display panel of claim 16, wherein the plurality of conductive pads further comprises a fourth conductive pad; the first common electrode, the second common electrode, the third common electrode, and the second bonding layer each being electrically connected to the fourth conductive pad, and the first bonding layer being connected to the fourth conductive pad;

the third bonding layer is provided with a first opening, the first opening further extending through the first independent electrode, the second conductive type semiconductor layer, the first light-emitting material layer, the first conductive type semiconductor layer, and the first common electrode, the first opening being filled with a first conductive bonding part, the first conductive bonding part being connected to the second bonding layer; the fourth bonding layer is provided with a second opening, the second opening being filled with a second conductive bonding part, and the second conductive bonding part being connected to the second common electrode and being bonded to the first conductive bonding part; and the fifth bonding layer is provided with a third opening, the third opening further extending through the second independent electrode, the fourth conductive type semiconductor layer, the second light-emitting material layer, and the third conductive type semiconductor layer, the third opening being filled with a third conductive bonding part, the third conductive bonding part being connected to the second common electrode; the sixth bonding layer is provided with a fourth opening, the fourth opening being filled with a fourth conductive bonding part, and the fourth conductive bonding part being connected to the third common electrode and bonded to the third conductive bonding part.

19. The display panel of claim 18, wherein the first opening to the fourth opening are disposed to be aligned in the direction perpendicular to the panel surface of the display panel.

20. The display panel of claim 18, wherein a first insulating layer is disposed between a portion of the first independent electrode extending into the first through-hole and a sidewall of the first through-hole;

a second insulating layer is disposed between the first electrical switching member and a sidewall of the first hollow hole, and a third insulating layer is disposed between a portion of the second independent electrode extending into the second through-hole and a sidewall of the second through-hole;

a fourth insulating layer is further disposed on sidewalls of the first connecting part and the second hollow hole, a fifth insulating layer is disposed between the second connecting part and a sidewall of the third hollow hole, and a sixth insulating layer is disposed between a portion of the third independent electrode extending into the third through-hole and a sidewall of the third through-hole; and a seventh insulating layer is disposed between the first conductive bonding part and a sidewall of the first opening, and an eighth insulating layer is disposed between the third conductive bonding part and a sidewall of the third opening.

* * * * *